United States Patent
Lin et al.

(10) Patent No.: US 12,203,971 B2
(45) Date of Patent: Jan. 21, 2025

(54) APPARATUS AND METHOD FOR INSPECTING LIGHT-EMITTING DIODE DIES

(71) Applicant: Industrial Technology Research Institute, Hsinchu (TW)

(72) Inventors: Yan-Rung Lin, Hsinchu (TW); Chih-Hsiang Liu, Hsinchu County (TW); Chung-Lun Kuo, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 162 days.

(21) Appl. No.: 18/075,431

(22) Filed: Dec. 6, 2022

(65) Prior Publication Data
US 2023/0184819 A1 Jun. 15, 2023

Related U.S. Application Data

(60) Provisional application No. 63/287,538, filed on Dec. 9, 2021.

(30) Foreign Application Priority Data

Jul. 8, 2022 (TW) .................... 111125797

(51) Int. Cl.
G01R 31/26 (2020.01)
G06T 7/00 (2017.01)
(52) U.S. Cl.
CPC ........ *G01R 31/2635* (2013.01); *G06T 7/0004* (2013.01); *G06T 2207/30148* (2013.01)
(58) Field of Classification Search
CPC .............. G01R 31/2635; G01R 31/308; G06T 7/0004; G06T 2207/30148
See application file for complete search history.

(56) References Cited

U.S. PATENT DOCUMENTS 7,446,321 B2  11/2008  Laurent et al.
9,638,741 B2   5/2017  Boeykens et al.
(Continued)

FOREIGN PATENT DOCUMENTS

CN   113740036   12/2021
TW   202024661    7/2020
TW   202024662    7/2020

OTHER PUBLICATIONS

Jae-Ho Song et al., "Role of photovoltaic effects on characterizing emission properties of InGaN/GaN light emitting diodes," Applied Physics Letters, No. 95, 263503, Dec. 2009, pp. 1-4.
(Continued)

*Primary Examiner* — Christopher P McAndrew
*Assistant Examiner* — Zannatul Ferdous
(74) *Attorney, Agent, or Firm* — JCIPRNET

(57) ABSTRACT

A method for inspecting LED dies includes the following steps. First electrodes and second electrodes of LED dies to be inspected are short-circuited via a conductive layer on an inspection substrate, or an inspection bias voltage is applied between the first electrodes and the second electrodes of the LED dies. An excitation light is irradiated on the LED dies to be inspected on the inspection substrate such that the LED dies to be inspected emit a secondary light. When the first electrodes and the second electrodes of the LED dies to be inspected are open, short-circuited, and/or subjected to the inspection bias voltage, the secondary light is captured via an optical sensor. An output of the optical sensor is received via a computer and a spectrum difference of the secondary light is calculated to determine whether the LED dies are abnormal or to classify the LED dies to be inspected.

16 Claims, 18 Drawing Sheets

(56) References Cited

U.S. PATENT DOCUMENTS

2019/0004105 A1* 1/2019 Henley .............. G01R 29/0821
2024/0178073 A1* 5/2024 Nakamura .......... H01L 33/0095

OTHER PUBLICATIONS

"Office Action of Taiwan Counterpart Application", issued on May 17, 2023, p. 1-p. 3.

* cited by examiner

APPARATUS AND METHOD FOR INSPECTING LIGHT-EMITTING DIODE DIES

CROSS-REFERENCE TO RELATED APPLICATION

This application claims the priority benefits of U.S. provisional application Ser. No. 63/287,538, filed on Dec. 9, 2021, and Taiwanese application serial no. 111125797, filed on Jul. 8, 2022. The entirety of each of the above-mentioned patent applications is hereby incorporated by reference herein and made a part of this specification.

TECHNICAL FIELD

The disclosure relates to an apparatus and a method for inspecting LED dies, and in particular, to an apparatus and a method that may efficiently perform comprehensive inspection of LED dies.

BACKGROUND

Micro light-emitting diodes (micro LEDs) or mini light-emitting diodes (mini LEDs) have advantages such as excellent display function, low power consumption, and long product life cycle, and are regarded as the next-generation display techniques. However, there are still many challenges to be overcome in the development of product manufacturing techniques. Currently, micro LEDs or mini LEDs still face many difficult challenges in product manufacturing and production technique. For example, issues such as epitaxy, device manufacture, mass transfer, die bonding, full color, panel defect repair, etc., still need to be overcome. Taking existing mass transfer techniques as an example, to test the opto-electrical properties of each micro LED or mini LED on a wafer often takes hours or even hundreds of hours of inspection time. Apparently, the existing mass transfer techniques lack efficient comprehensive inspection methods.

SUMMARY

The disclosure provides an apparatus and a method for inspecting LED dies.

The disclosure provides an apparatus for inspecting LED dies suitable for inspecting a plurality of LED dies having first electrodes and second electrodes. The apparatus for inspecting LED dies includes an inspection substrate, a light source, an optical sensor, and a computer. The inspection substrate has a conductive layer, wherein the inspection substrate shorts the first electrode and the second electrode of each of the plurality of LED dies to be inspected via the conductive layer, or the inspection substrate applies an inspection bias voltage between the first electrodes and the second electrodes of the plurality of LED dies to be inspected via the conductive layer. The light source provides an excitation light to irradiate the plurality of LED dies to be inspected, and the plurality of LED dies to be inspected emit a secondary light after being irradiated by the excitation light. The optical sensor captures the secondary light when the first electrodes and the second electrodes of the plurality of LED dies to be inspected are open, short-circuited, and/or subjected to the inspection bias voltage. The computer is electrically connected with the optical sensor to receive an output of the optical sensor.

The disclosure also provides a method for inspecting LED dies including the following steps. A first electrode and a second electrode of each of a plurality of LED dies to be inspected are short-circuited via a conductive layer on an inspection substrate, or an inspection bias voltage is applied between the first electrodes and the second electrodes of the plurality of LED dies to be inspected via the conductive layer of the inspection substrate. The plurality of LED dies to be inspected are irradiated with an excitation light, so that the plurality of LED dies to be inspected emit a plurality of secondary light. The plurality of secondary light are captured via an optical sensor when the first electrodes and the second electrodes of the plurality of LED dies to be inspected are open, short-circuited, and/or subjected to the inspection bias voltage. An output of the optical sensor is received via a computer and a spectrum difference of the plurality of secondary light is calculated to determine whether the plurality of LED dies are abnormal or to classify the plurality of LED dies to be inspected.

Based on the above, in an embodiment of the disclosure, excitation light is provided when the electrodes of the LED dies to be inspected are open, short-circuited, and/or subjected to inspection bias voltage, the secondary light emitted by the LED dies is captured under the above different conditions, and whether the LED dies are abnormal or not or classified is determined according to the captured secondary light. Therefore, the embodiments of the disclosure may efficiently perform comprehensive inspection on the LED dies.

DETAILED DESCRIPTION OF DISCLOSED EMBODIMENTS

Figure 1A:
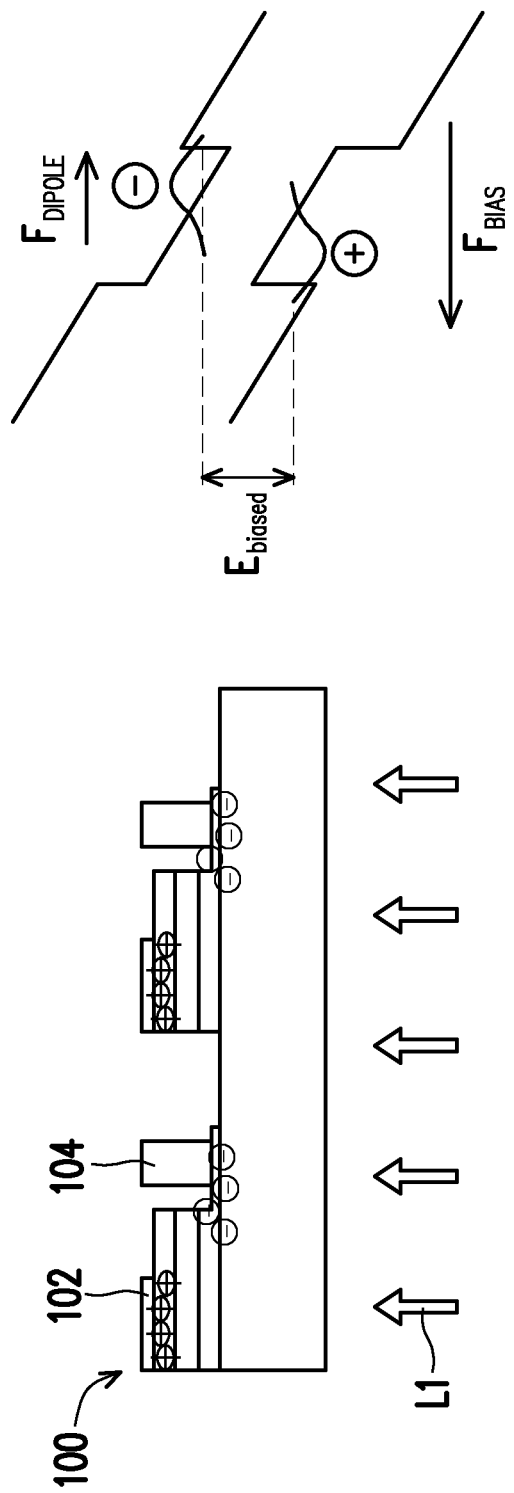
FIG. 1A is a schematic diagram showing that energy band is bent when the first electrode and the second electrode of an LED die are open.
Figure 1B:
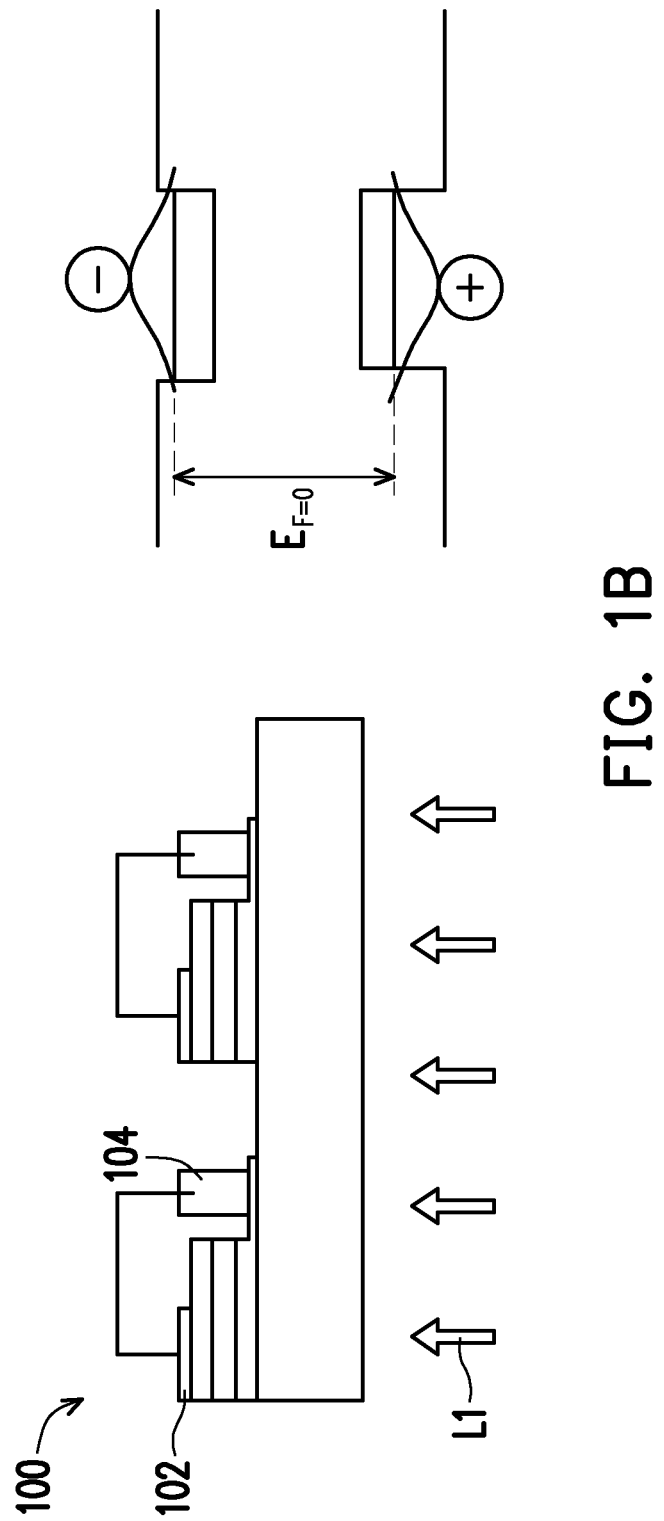
FIG. 1B is a schematic diagram showing that energy band is not bent when the first electrode and the second electrode of an LED die are short-circuited.
Figure 2:
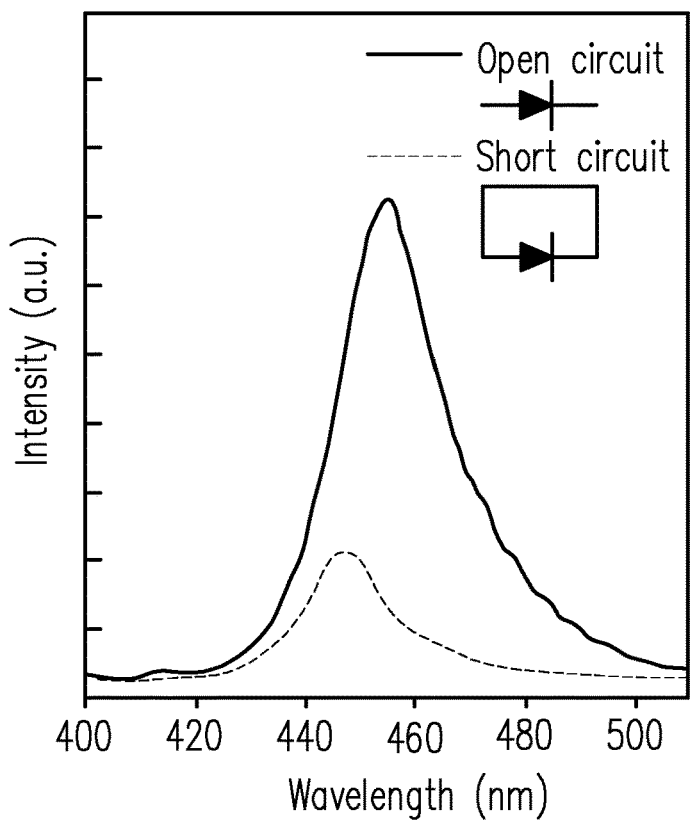
FIG. 2 shows the spectrum of secondary light measured after an LED die is irradiated with excitation light when the first electrode and the second electrode of the LED die are open and short-circuited.

FIG. 1A is a schematic diagram showing that energy band is bent when the first electrode and the second electrode of an LED die are open. FIG. 1B is a schematic diagram showing that energy band is not bent when the first electrode and the second electrode of an LED die are short-circuited. FIG. 2 shows the spectrum of secondary light measured after an LED die is irradiated with excitation light when the first electrode and the second electrode of the LED die are open and short-circuited.

Referring to FIG. 1A, an embodiment of the disclosure utilizes the Quantum Confined Stark Effect (QCSE) to bend the energy band of LED dies 100 to be inspected. Under the action of an electric field, the spatial distribution and overlapping state of the wave functions of electrons and holes in the quantum wells of the LED dies 100 to be inspected are changed, so that the energy band of the LED dies 100 to be inspected is bent, resulting in a shift in the emission wavelength or a change in the light intensity of the LED dies 100 to be inspected. In an embodiment of the disclosure, the QCSE is applied to the inspection of the LED dies 100, and an excitation light L1 is used to irradiate the plurality of LED dies 100 to be inspected, so that the LED dies 100 to be inspected are excited by the excitation light L1 to emit secondary light (not shown in FIG. 1A).

Referring to FIG. 1A and FIG. 2, when the excitation light L1 irradiates the LED dies 100 to be inspected to generate electrons and holes in the LED dies 100 to be inspected, since first electrodes 102 and second electrodes 104 of the LED dies 100 to be inspected are in an open-circuit state, electrons and holes generated in the LED dies 100 to be inspected are accumulated near the first electrodes 102 and the second electrodes 104, respectively, and therefore a stronger internal electric field is formed in the LED dies 100 to be inspected. When the excitation light L1 is irradiated on the LED dies 100 to be inspected in which the first electrodes 102 and the second electrodes 104 are in an open-circuit state, the stronger internal electric field formed in the LED dies 100 to be inspected causes the secondary light emitted by the LED dies 100 to be inspected to have a longer wavelength and a higher intensity. The wavelength includes the peak wavelength or dominant wavelength of the secondary light, and the intensity includes the intensity of the peak wavelength of the secondary light or the intensity of the overall spectrum of the secondary light. Here, the dominant wavelength refers to a weighted average value obtained by multiplying each wavelength by the weight thereof.

Referring to FIG. 1B and FIG. 2, when the excitation light L1 irradiates the LED dies 100 to be inspected to generate electrons and holes in the LED dies 100 to be inspected, since the first electrodes 102 and the second electrodes 104 of the LED dies 100 to be inspected are in a short-circuit state, electrons and holes generated in the LED dies 100 to be inspected are not accumulated. Instead, the conductive first electrodes 102 and second electrodes 104 achieve electrical neutralization, thereby forming a weaker internal electric field reduction in the LED dies 100 to be inspected. When the excitation light L1 is irradiated on the LED dies 100 to be inspected in which the first electrodes 102 and the second electrodes 104 are in a short-circuit state, the weaker internal electric field or lack of internal electric field formed in the LED dies 100 to be inspected causes the secondary light emitted by the LED dies 100 to be inspected to have a shorter wavelength and a lower intensity (compared to the state when the first electrodes 102 and the second electrodes 104 are in an open-circuit state). The wavelength includes the peak wavelength or dominant wavelength of the secondary light, and the intensity includes the intensity of the peak wavelength of the secondary light or the intensity of the overall spectrum of the secondary light.

As shown in FIG. 2, if the LED dies 100 to be inspected are in a normal state, when the first electrodes 102 and the second electrodes 104 in the LED dies 100 are in a short-circuit state, the secondary light emitted by the LED dies 100 after being irradiated by the excitation light L1 have a shorter wavelength and a smaller intensity, and when the first electrodes 102 and the second electrodes 104 in the LED dies 100 are in an open-circuit state, the secondary light emitted by the LED dies 100 have a longer wavelength and a higher intensity. In other words, during the inspection process, if it is observed that the secondary light emitted by the LED dies 100 after being irradiated by the excitation light L1 have a certain degree of difference in wavelength and intensity under different states (i.e., the open-circuit state and the short-circuit state), then it may be determined that the LED dies 100 to be inspected are in a normal state. In contrast, during the inspection process, if it is observed that the secondary light emitted by the LED dies 100 does not have a certain degree of difference in wavelength or intensity under different states (i.e., the open-circuit state and the short-circuit state), it may be determined that the LED dies 100 to be inspected are in an abnormal state.

Figure 3:
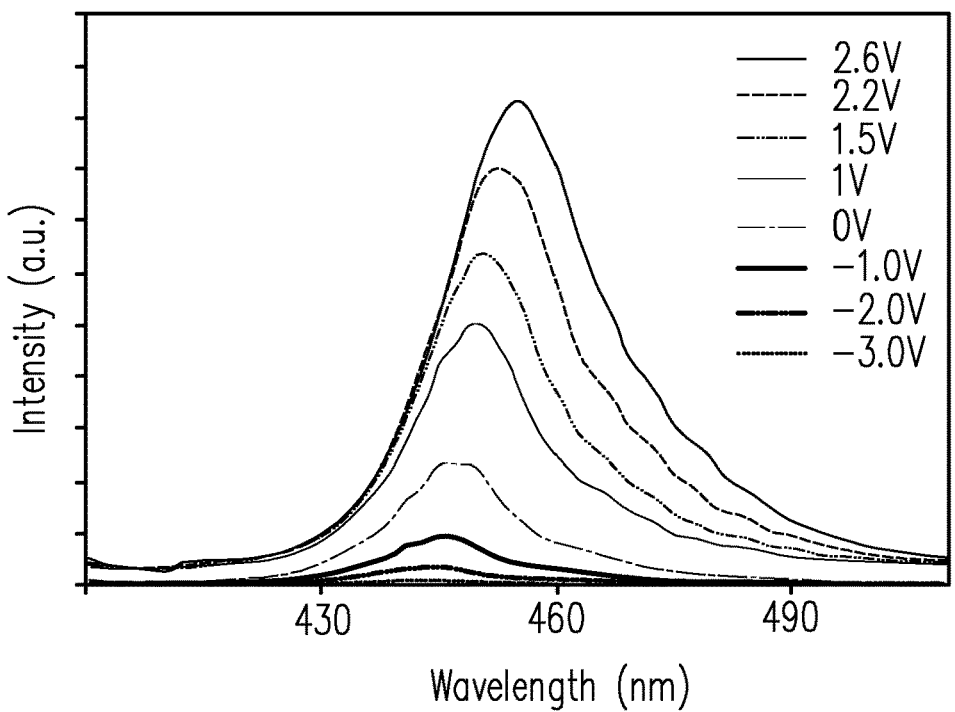
FIG. 3 shows the spectrum of secondary light measured after an LED die is irradiated with excitation light when different inspection bias voltages are applied between the first electrode and the second electrode of the LED die.

FIG. 3 shows the spectrum of secondary light measured after an LED die is irradiated with excitation light when different inspection bias voltages are applied between the first electrode and the second electrode of the LED die.

Referring to FIG. 1A and FIG. 3, in addition to that the first electrodes 102 and the second electrodes 104 of the LED dies 100 are in an open-circuit state (as shown in FIG. 1A) or a short-circuit state (as shown in FIG. 1B), during the inspection process of the LED dies 100, different inspection bias voltages may be applied between the first electrodes 102 and the second electrodes 104 of the LED dies 100, and then the LED dies 100 to be inspected are irradiated with the excitation light L1, and the spectrum of the secondary light emitted by the LED dies 100 to be inspected under different inspection bias voltages is measured. In an embodiment of the disclosure, inspection bias voltages are less than the threshold voltage (Vth) of the LED dies 100.

As shown in FIG. 3, during the inspection process of the LED dies 100, different inspection bias voltages such as −3.0V, −2.0V, −1.0V, +1.0V, +1.5V, +2.5V, +2.6V are applied between the first electrodes 102 and the second electrodes 104 by using a probe to spot the diode dies, then the LED dies 100 to be inspected are irradiated with the excitation light L1, and the spectrum of the secondary light emitted by the LED dies 100 to be inspected under different inspection bias voltages is measured. It may be known from FIG. 3 that when the inspection bias voltages applied between the first electrode 102 and the second electrode 104 are higher, the secondary light emitted by the normal LED die 100 to be inspected has a longer wavelength and a higher intensity. Similarly, during the inspection process of the LED dies 100 in the disclosure, an external inspection bias voltage may be applied between the first electrodes 102 and the second electrodes 104 of the LED dies 100. If the LED dies 100 to be inspected are in a normal state, when different inspection bias voltages are applied between the first electrodes 102 and the second electrodes 104 of the LED dies 100, the secondary light emitted by the LED dies 100 exhibits the change trend shown in FIG. 3. During the inspection process, if it is observed that the change trend of the wavelength and intensity of the secondary light emitted by the LED dies 100 after being irradiated by the excitation light L1 under different inspection bias voltage states is similar to the change trend in FIG. 3, it may be determined that the LED dies 100 to be inspected are in a normal state. In contrast, during the inspection process, if it is observed that the change trend of the wavelength and intensity of the secondary light emitted by the LED dies 100 under different inspection bias voltage states is different from the change trend in FIG. 3, it may be determined that the LED dies 100 to be inspected are in an abnormal state. For example, when the applied voltage is gradually increased from −3.0V to +2.6V, the corresponding peak wavelength of the secondary light is sequentially increased from 445 nm to 460 nm by about 2.5 nm to 3 nm. At this point, the change trend is similar to the change trend in FIG. 3, and it may be determined that the LED dies 100 to be inspected are in a normal state; under the same applied voltage range, if the range in which the corresponding peak wavelength of the secondary light is sequentially increased exceeds a reasonable range (for example, sequentially increased by about 17 nm or about 0.2 nm, the overall size is larger or smaller), it may be determined that the LED dies 100 to be inspected are in an abnormal state. In other embodiments, the average value of the peak wavelengths of a plurality of LED dies to be inspected increasing with the increase of the applied voltage (hereinafter referred to as the peak wavelength incremental average value) may be used as a comparison benchmark. For example, assuming that the incremental average value of the peak wavelengths of a plurality of LED dies to be inspected is 2 nm as a comparison benchmark, when the incremental average value of the peak wavelength of a certain LED die to be inspected is about 2 nm, it may be determined that the LED die 100 to be inspected is in a normal state; if the incremental average value of the peak wavelength of a certain LED die to be inspected is 17 nm, then it may be determined that the LED die 100 to be inspected is in an abnormal state.

In other embodiments, under the same applied voltage, the average value of the peak wavelengths of a plurality of LED dies to be inspected (hereinafter referred to as the average value of peak wavelengths) may be used as a comparison benchmark. For example, assuming that the average value of the peak wavelengths of the plurality of LED dies to be inspected is Aa as a comparison benchmark, when the peak wavelength of a certain LED die to be inspected falls within the range of $\lambda a \pm (0.02\lambda a)$, it may be determined that the LED die 100 to be inspected is in a normal state; if the peak wavelength of a certain LED die to be inspected does not fall within the range of $(\lambda a \pm 0.02\lambda a)$, it may be determined that the LED die 100 to be inspected is in an abnormal state. The above is an example where a deviation of 2% from the average value is regarded as abnormal. The threshold value may be changed according to requirements.

FIG. 4A, FIG. 4B, FIG. 5A, FIG. 5B, FIG. 6A, and FIG. 6B are schematic diagrams showing an apparatus for inspecting LED dies according to the first embodiment of the disclosure.

Referring to FIG. 4A, FIG. 4B, FIG. 5A, FIG. 5B, FIG. 6A, and FIG. 6B, an apparatus 200 for inspecting LED dies is suitable for inspecting the plurality of LED dies 100 to be inspected at the same time. In some embodiments, the LED dies 100 to be inspected include a plurality of LED dies in a semiconductor wafer. In other embodiments, the LED dies 100 to be inspected include a plurality of LED dies bonded to a driving backplane. In the present embodiment, the LED dies 100 include the first electrodes 102, the second electrodes 104, and epitaxial layers 106, wherein the first electrodes 102 and the second electrodes 104 are respectively distributed on the upper and lower sides of the epitaxial layers 106, and the first electrodes 102 and the second electrodes 104 are electrically insulated from each other, and the first electrodes 102 and the second electrodes 104 are respectively electrically connected to different types of doped epitaxial material layers (e.g., P-type doped epitaxial material layer and N-type doped epitaxial material layer) in the epitaxial layers 106. In other words, the LED dies 100 in the present embodiment are vertical-type LED dies.

Figure 4A:
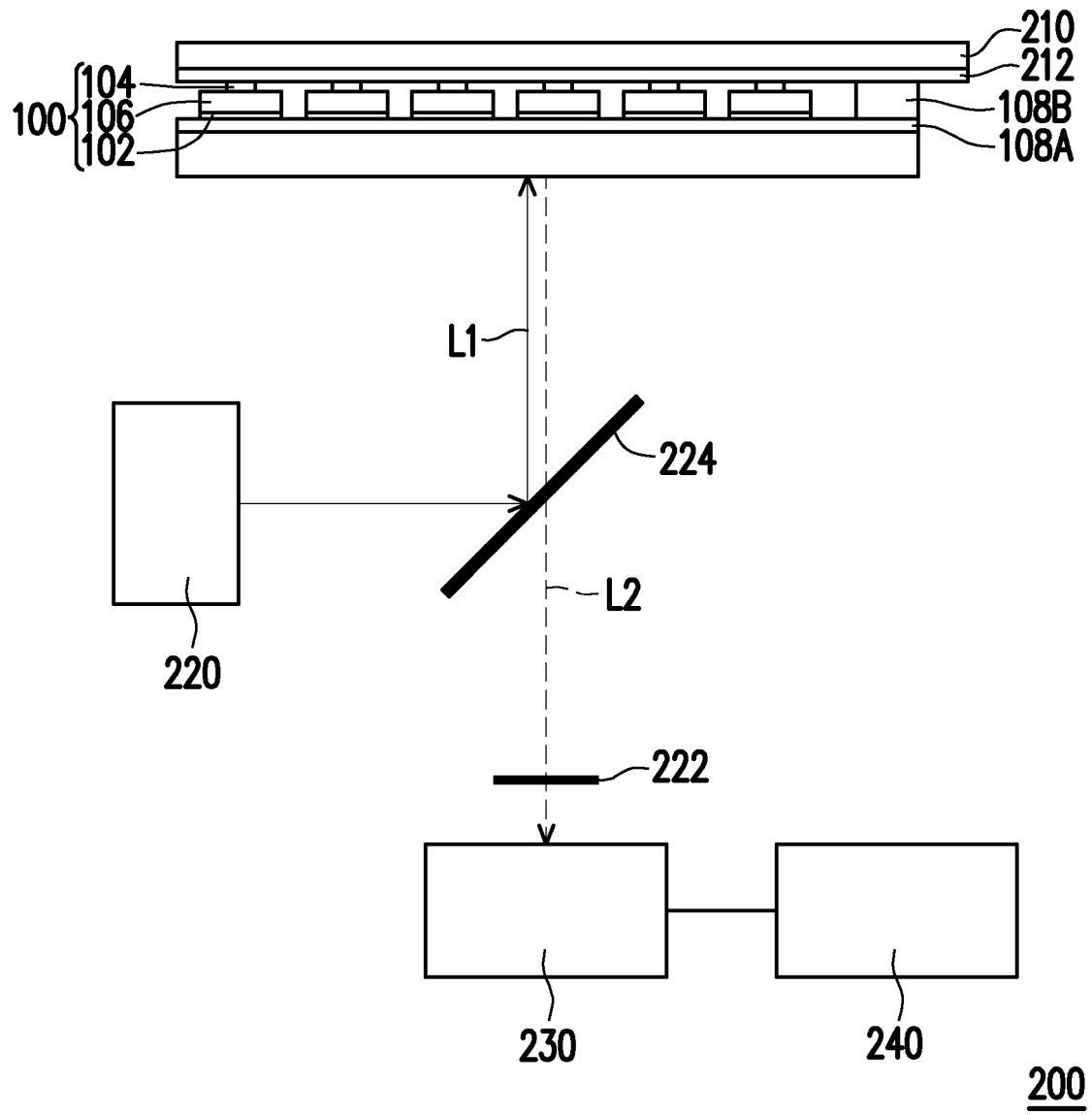
FIG. 4A, FIG. 4B, FIG. 5A, FIG. 5B, FIG. 6A, and FIG. 6B are schematic diagrams showing an apparatus for inspecting LED dies according to the first embodiment of the disclosure.
Figure 4B:
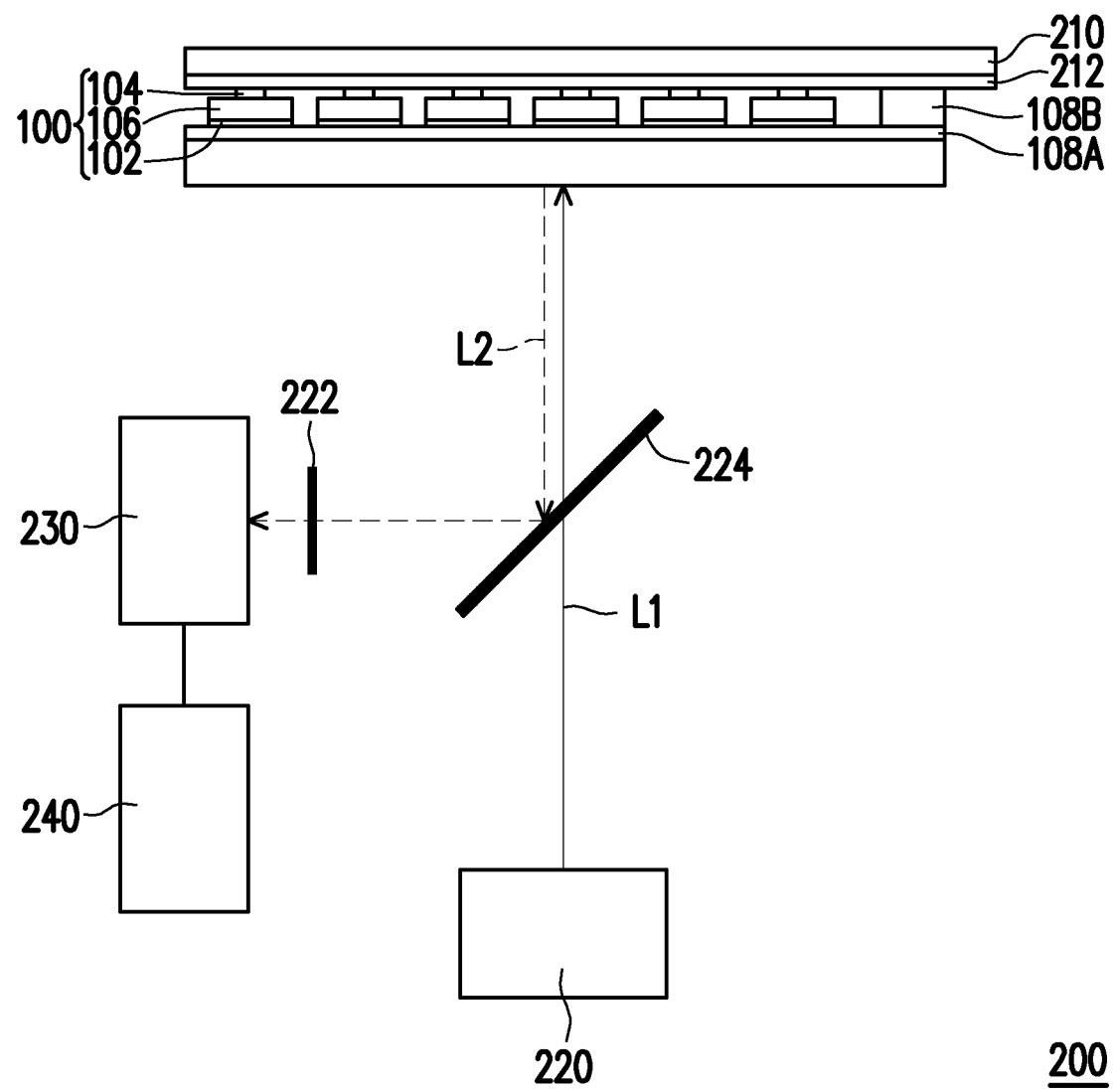
Figure 5A:
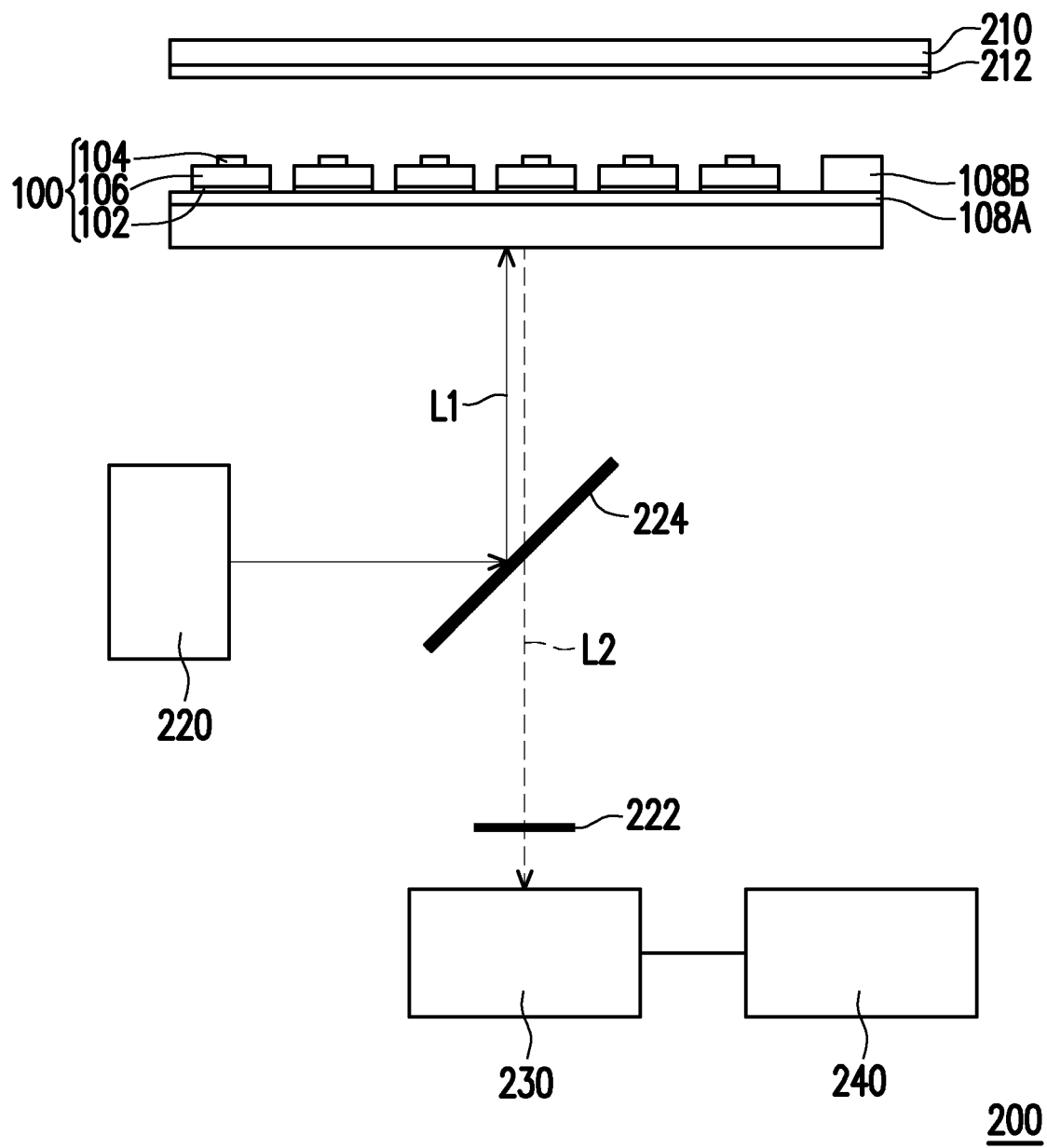
Figure 5B:
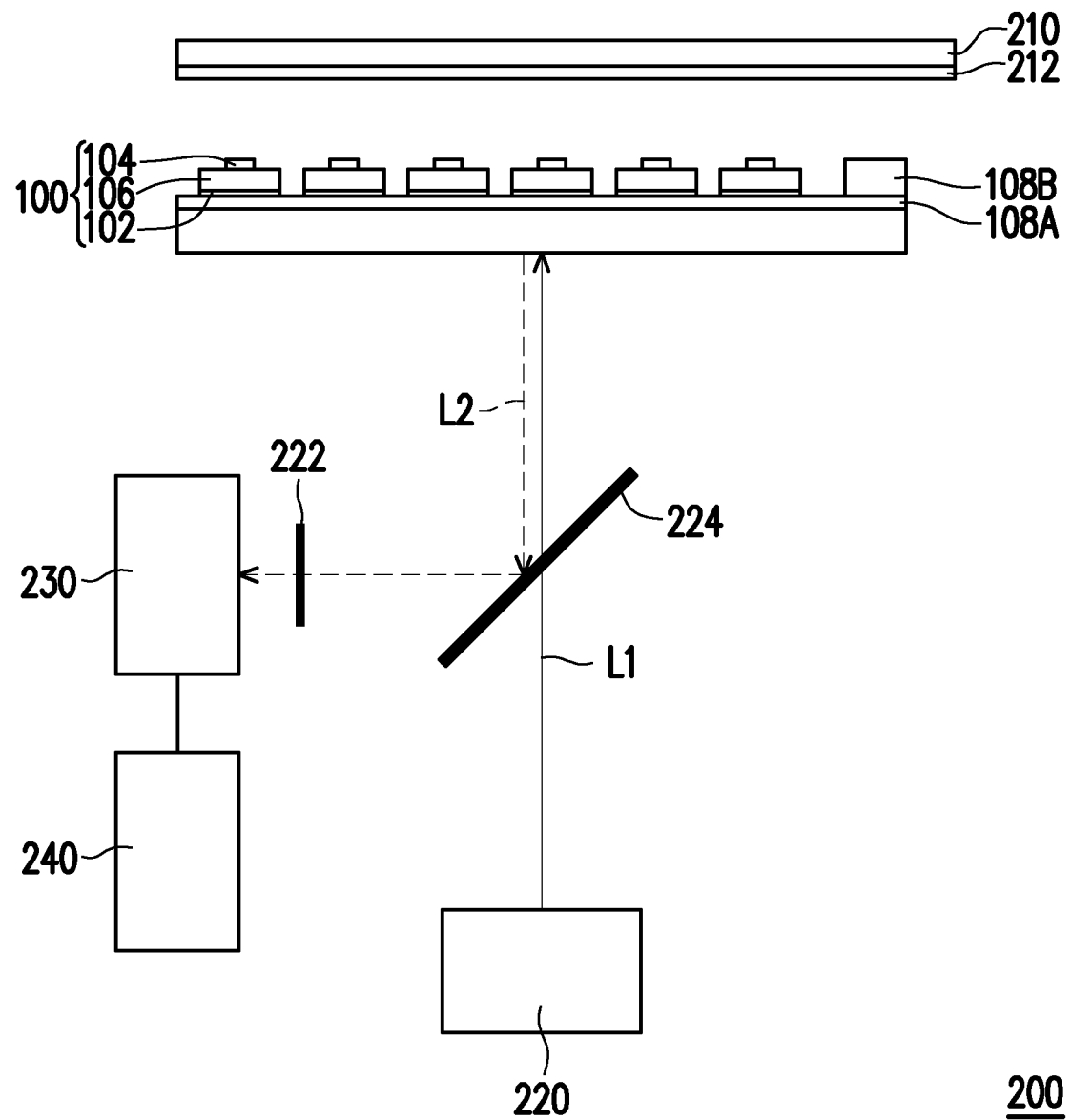
Figure 6A:
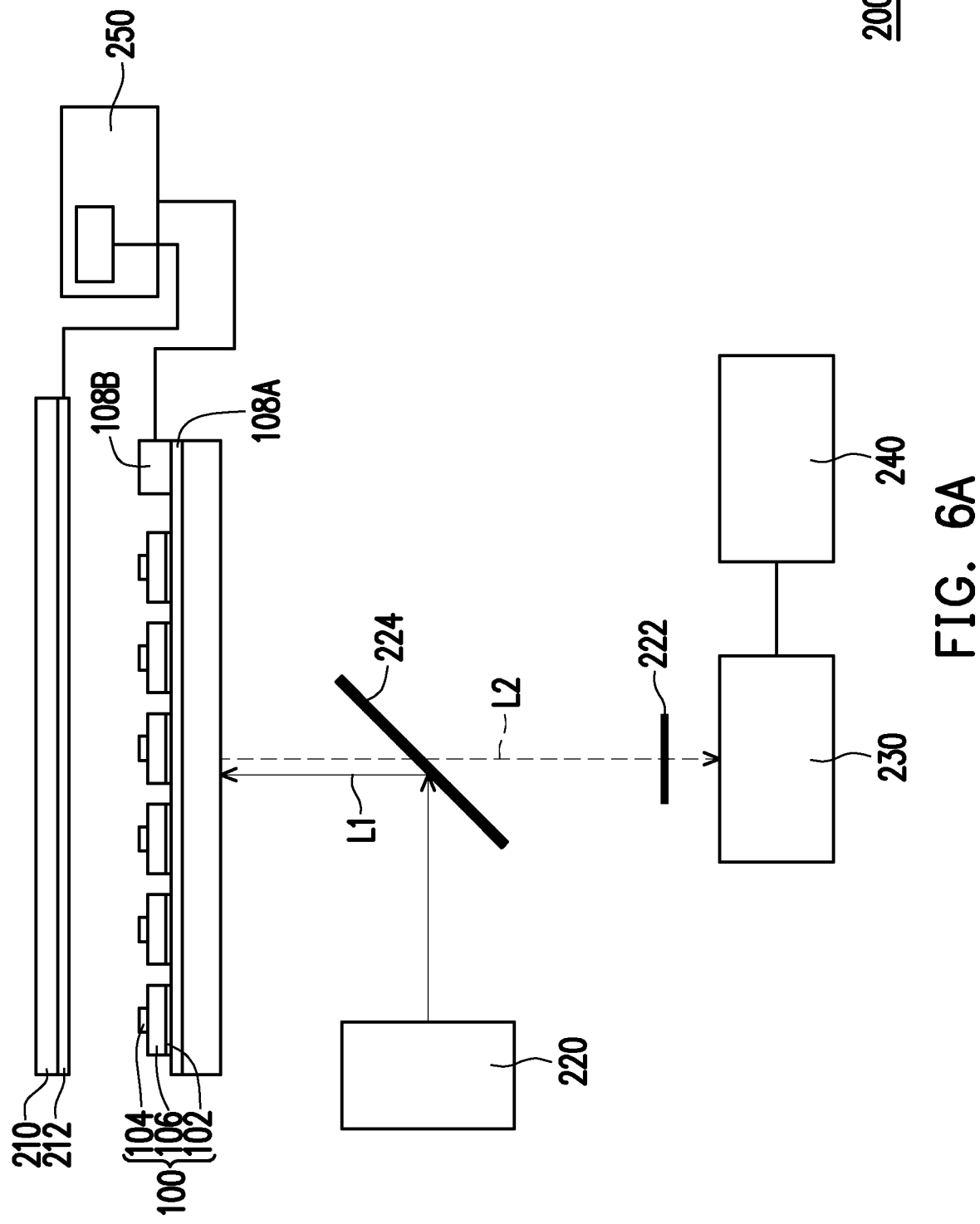
Figure 6B:
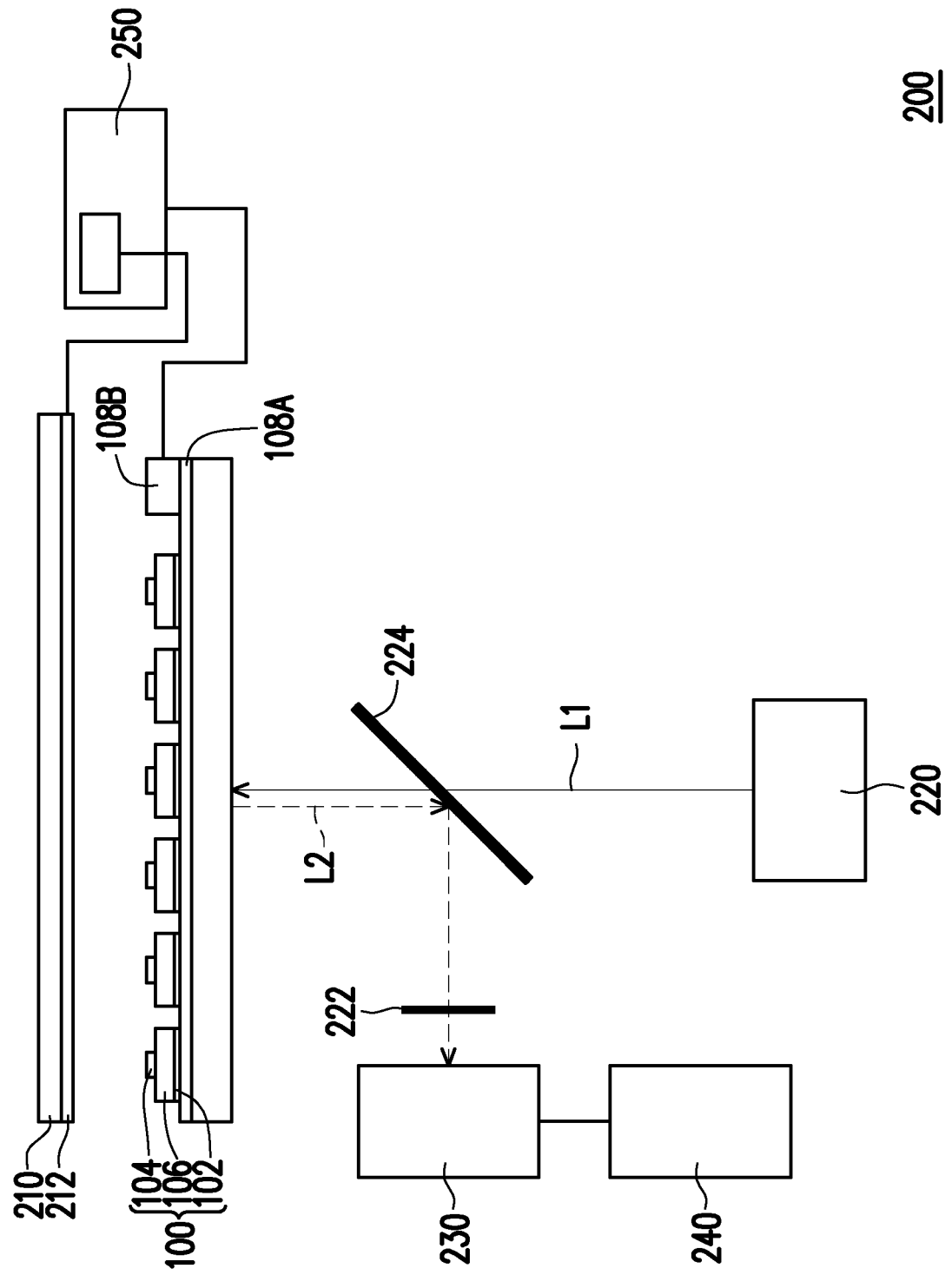

As shown in FIG. 4A, FIG. 4B, FIG. 5A, FIG. 5B, FIG. 6A, and FIG. 6B, the apparatus 200 for inspecting LED dies includes an inspection substrate 210, a light source 220, an optical sensor 230, and a computer 240. In some embodiments, the inspection apparatus 200 may further include an optical device 222 and an optical device 224, wherein the optical device 222 is a long-pass filter or a bandpass filter that may improve the spectral purity of a secondary light L2 received by the optical sensor 230, and the optical device 224 is a beam splitter or a dichroic filter capable of reflecting the excitation light L1 or the secondary light L2. In some embodiments, the inspection substrate 210 has a conductive layer 212, and the inspection substrate 210 is a rigid substrate or a flexible substrate that may be moved in the vertical direction. Via proper movement of the inspection substrate 210, the conductive layer 212 on the inspection substrate 210 may make the first electrodes 102 and the second electrodes 104 of the LED dies 100 to be inspected be in different states. In other possible embodiments, the inspection substrate 210 has the conductive layer 212, and the inspection substrate 210 is a rigid substrate or a flexible substrate disposed at different positions according to inspection requirements, and via proper setting of the inspection substrate 210, the conductive layer 212 on the inspection substrate 210 may make the first electrodes 102 and the second electrodes 104 of the LED dies 100 to be inspected be in different states (e.g., short-circuit state, open-circuit state, or biased state). When the conductive layer 212 on the inspection substrate 210 is in contact with a conductive pad 108B and the second electrodes 104 at the same time, the first electrodes 102 and the second electrodes 104 of the LED dies 100 to be inspected are in a short-circuit state, as shown in FIG. 4A and FIG. 4B. When a sufficient distance is maintained between the conductive layer 212 on the inspection substrate 210 and the second electrodes 104 of the conductive pad 108B, the first electrodes 102 and the second electrodes 104 of the LED dies 100 to be inspected are in an open-circuit state, as shown in FIG. 5A and FIG. 5B. When a distance is maintained between the conductive layer 212 on the inspection substrate 210 and the conductive pad 108B and the second electrodes 104 to enable non-contact electrical coupling, and when matched with a bias voltage applying device 250 electrically connected to the conductive layer 212 and the conductive pad 108B, the LED dies 100 to be inspected are in a biased state, as shown in FIG. 6A and FIG. 6B. Here, non-contact electrical coupling means that the conductive layer 212 and the second electrodes 104 and the conductive pad 108B are not in direct contact, but voltage is applied with an intermediate medium, such as: air or water gaps and a capacitive-like effect is formed.

As shown in FIG. 4A and FIG. 4B, the first electrode 102 of each of the LED dies 100 to be inspected may be electrically connected to the second electrode 104 of each of the LED dies 100 to be inspected via a conductive layer 108A, the conductive pad 108B, and the conductive layer 212 of the inspection substrate 210. In other possible embodiments, the first electrode 102 of each of the LED dies 100 to be inspected may be integrated with the conductive layer 108A to form the same conductive layer. In other words, the first electrode 102 may be omitted, and the conductive layer 108A may be directly used as the electrode of each of the LED dies 100 to be inspected. As shown in FIG. 4A, the optical device 224 reflects the excitation light L1 and allows the secondary light L2 to pass through, and the optical device 222 is used to improve the spectral purity of the secondary light L2 passing through the optical device 224. As shown in FIG. 4B, the optical device 224 allows the excitation light L1 to pass through and reflects the secondary light L2, and the optical device 222 is used to improve the spectral purity of the secondary light L2 reflected by the optical device 224.

As shown in FIG. 5A and FIG. 5B, the conductive layer 212 on the inspection substrate 210 may be kept a sufficient distance from the first electrodes 102 and the second electrodes 104 of the LED dies 100 to be inspected via proper movement or proper setting of the inspection substrate 210, so that the first electrodes 102 and the second electrodes 104 of the LED dies 100 to be inspected are in an open-circuit state. In other possible embodiments, the first electrode 102 of each of the LED dies 100 to be inspected may be integrated with the conductive layer 108A to form the same conductive layer. In other words, the first electrode 102 may be omitted, and the conductive layer 108A may be directly used as the electrode of each of the LED dies 100 to be inspected. As shown in FIG. 5A, the optical device 224 reflects the excitation light L1 and allows the secondary light L2 to pass through, and the optical device 222 is used to improve the spectral purity of the secondary light L2 passing through the optical device 224. As shown in FIG. 5B, the optical device 224 allows the excitation light L1 to pass through and reflects the secondary light L2, and the optical device 222 is used to improve the spectral purity of the secondary light L2 reflected by the optical device 224.

As shown in FIG. 6A and FIG. 6B, via the proper movement or proper setting of the inspection substrate 210 and with the bias voltage applying device 250 electrically connected to the conductive layer 212, the conductive layer 108A, and the conductive pad 108B, the bias voltage applying device 250 may apply various inspection bias voltages between the first electrodes 102 and the second electrodes 104 of the LED dies 100 to be inspected via the conductive layer 212 and the conductive pad 108B on the inspection substrate 210. In other possible embodiments, the first electrode 102 of each of the LED dies 100 to be inspected may be integrated with the conductive layer 108A to form the same conductive layer. In other words, the first electrode 102 may be omitted, and the conductive layer 108A may be directly used as the electrode of each of the LED dies 100 to be inspected. As shown in FIG. 6A, the optical device 224 reflects the excitation light L1 and allows the secondary light L2 to pass through, and the optical device 222 is used to improve the spectral purity of the secondary light L2 passing through the optical device 224. As shown in FIG. 6B, the optical device 224 allows the excitation light L1 to pass through and reflects the secondary light L2, and the optical device 222 is used to improve the spectral purity of the secondary light L2 reflected by the optical device 224.

The light source 220 provides the excitation light L1 to irradiate the LED dies 100 to be inspected on the inspection substrate 210, and the LED dies 100 to be inspected emit the secondary light L2 after being irradiated by the excitation light L1, and the wavelength of L2 is greater than the wavelength of L1. In some embodiments, the light source 220 includes UV light or other light sources sufficient to excite the LED dies 100 to be inspected to generate secondary light, such as an LED light source or a laser light source. In some embodiments, the excitation light L1 provided by the light source 220 may be irradiated to some or all of the LED dies 100 to be inspected. The light source 220 is disposed below the inspection substrate 210, and the optical sensor 230 is also disposed below the inspection substrate 210. In other words, the light source 220 and the optical sensor 230 are disposed on the same side of the inspection substrate 210.

When the first electrodes 102 and the second electrodes 104 of the LED dies 100 to be inspected are short-circuited, the optical sensor 230 captures the secondary light L2 emitted by each of the LED dies 100 to be inspected, and the wavelength of L2 is greater than the wavelength of L1. In some embodiments, the optical capture range of the optical sensor 230 covers a portion of the LED dies 100 to be inspected. In other words, the optical sensor 230 needs multiple optical captures to capture the secondary light L2 emitted by all the LED dies 100 to be inspected. In other embodiments, the optical capture range of the optical sensor 230 may cover all the LED dies 100 to be inspected. In other words, the optical sensor 230 may capture the secondary light L2 emitted by all the LED dies 100 to be inspected simply via a single optical capture.

In some embodiments, the optical sensor 230 includes a spectrometer that may be used to measure the peak wavelength, the dominant wavelength, and the intensity of the peak wavelength of the secondary light L2 emitted by the LED dies 100 to be inspected. In the present embodiment, the spectrometer includes a line spectrometer, an area spectrometer, or other types of spectrometers. In other embodiments, the optical sensor 230 includes an image sensor capable of measuring the peak wavelength, the dominant wavelength, and the overall spectral intensity of the secondary light L2 emitted by the LED dies 100 to be inspected. For example, an area light sensor with a filter or grating may be used to measure the peak wavelength or dominant wavelength of the secondary light L2 emitted by the LED dies 100 to be inspected. In addition, an area light sensor may be used to measure the spectral intensity of the secondary light L2 emitted by the LED dies 100 to be inspected.

FIG. 7A, FIG. 7B, FIG. 8A, and FIG. 8B are schematic diagrams showing an apparatus for inspecting LED dies according to the second embodiment of the disclosure.

Figure 7A:
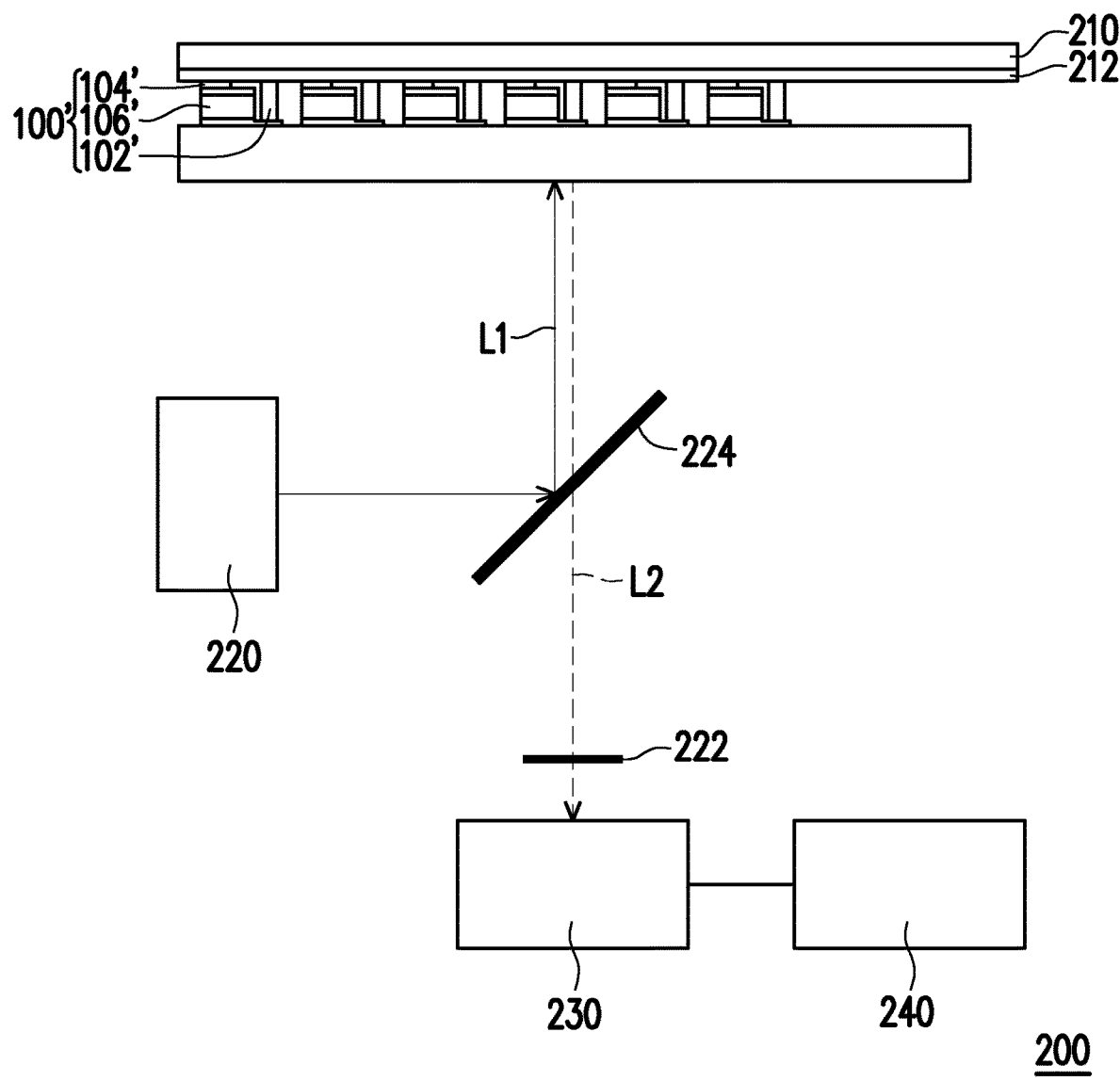
FIG. 7A, FIG. 7B, FIG. 8A, and FIG. 8B are schematic diagrams showing an apparatus for inspecting LED dies according to the second embodiment of the disclosure.
Figure 7B:
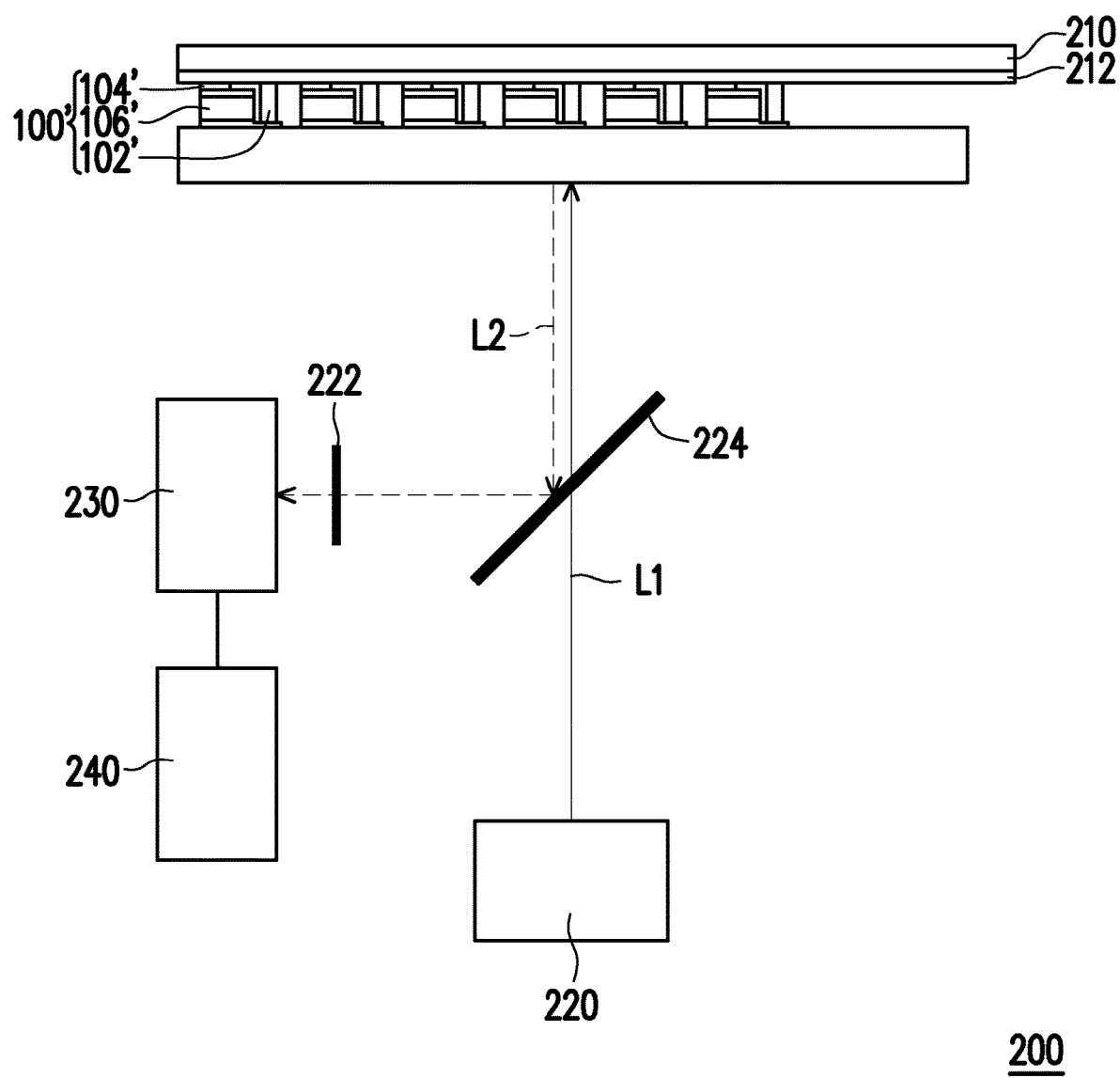
Figure 8A:
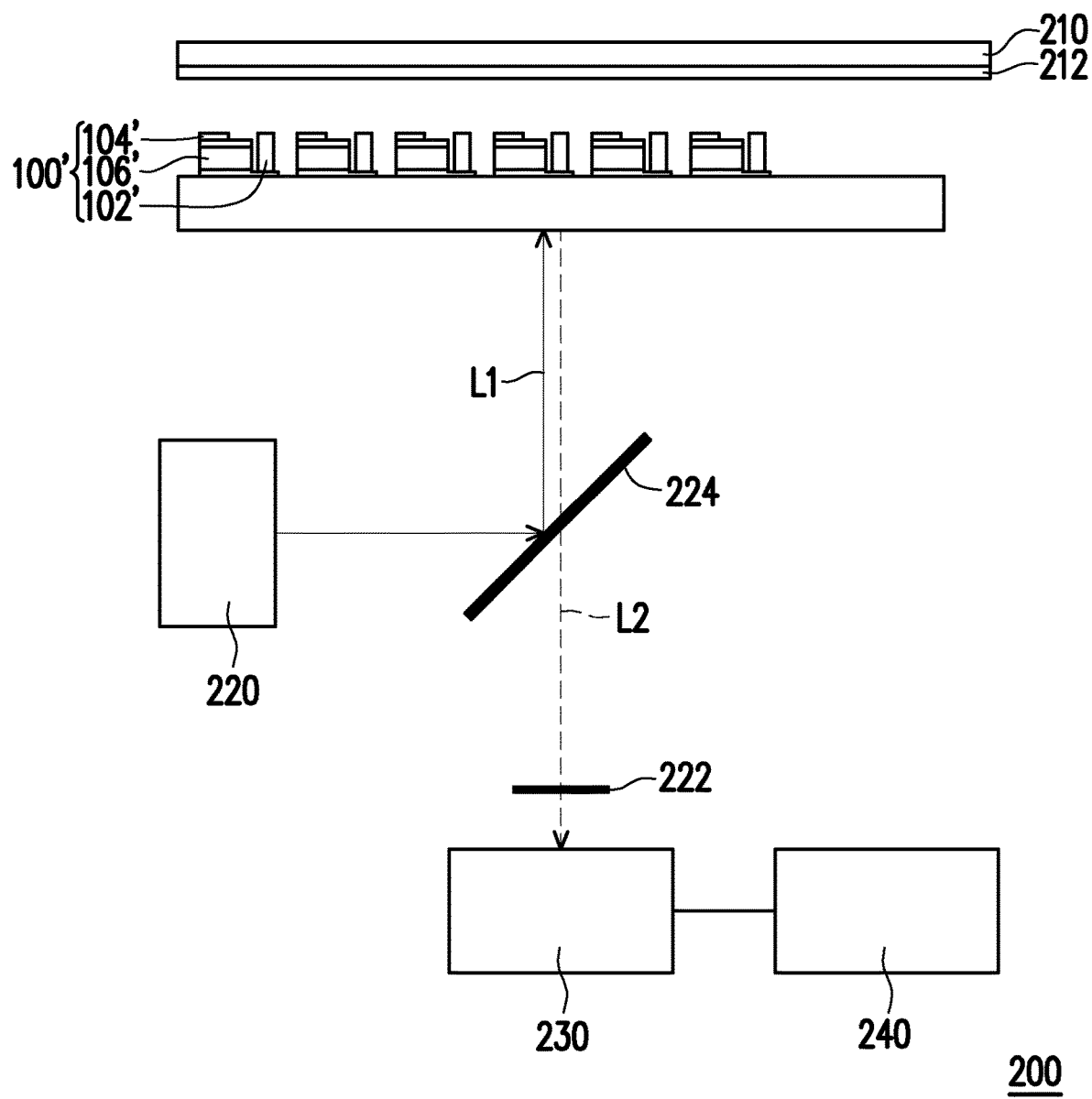
Figure 8B:
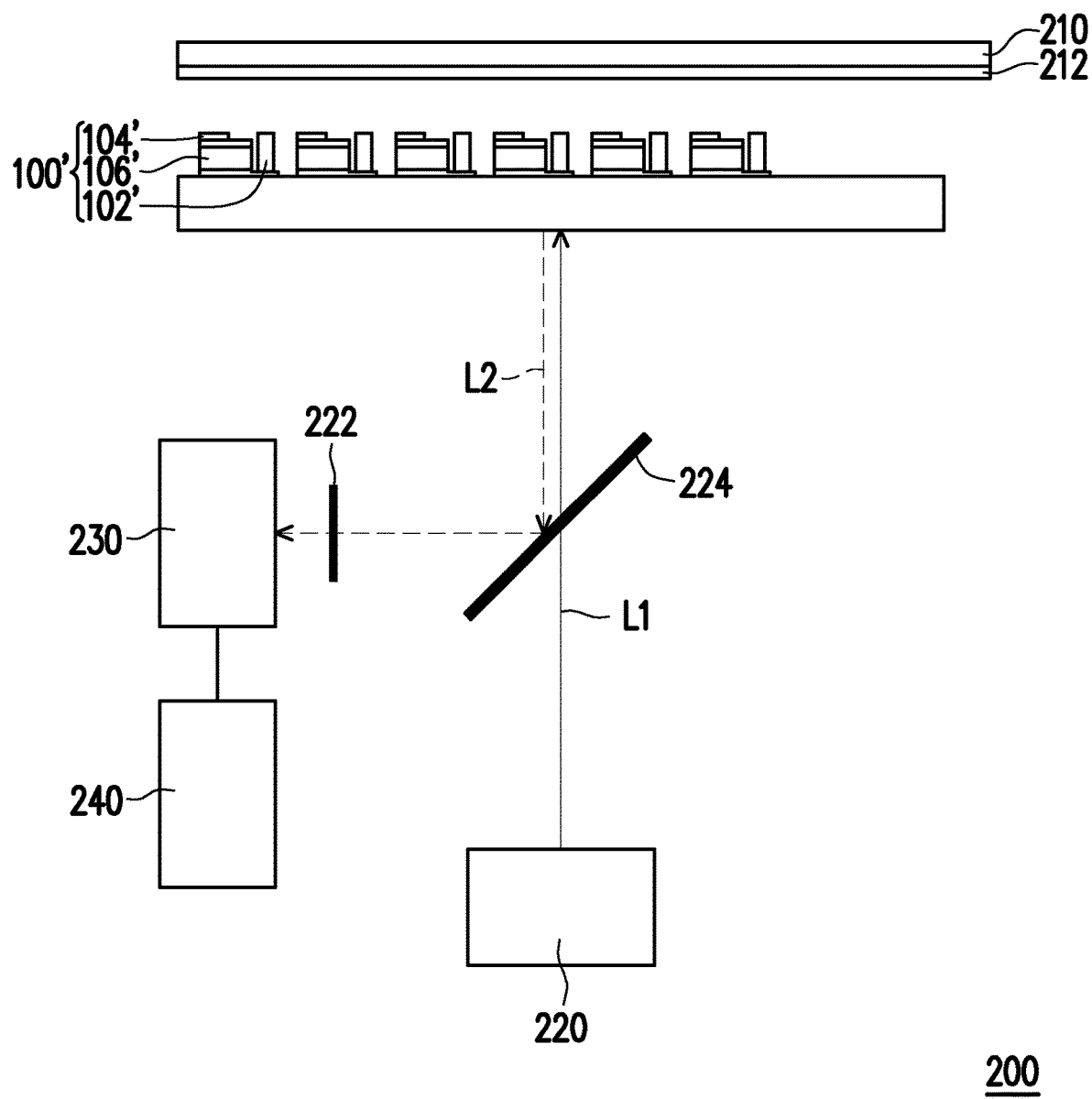

Referring to FIG. 7A, FIG. 7B, FIG. 8A, and FIG. 8B, an apparatus 200' for inspecting LED dies is suitable for inspecting a plurality of LED dies 100' to be inspected at the same time. In some embodiments, the LED dies 100' to be inspected include a plurality of LED dies in a semiconductor wafer. In other embodiments, the LED dies 100' to be inspected include a plurality of LED dies bonded to a driving backplane. In the present embodiment, the LED dies 100' include first electrodes 102', second electrodes 104', and epitaxial layers 106', wherein the first electrodes 102' and the second electrodes 104' are distributed on the same side (for example, the upper side) of the epitaxial layers 106', and the first electrodes 102' and the second electrodes 104' are electrically insulated from each other, and the first electrodes 102' and the second electrodes 104' are respectively electrically connected to different types of doped epitaxial material layers (e.g., P-type doped epitaxial material layer and N-type doped epitaxial material layer) in the epitaxial layers 106'. In other words, the LED dies 100' in the present embodiment are horizontal-type LED dies. As shown in FIG. 7A and FIG. 8A, the optical device 224 reflects the excitation light L1 and allows the secondary light L2 to pass through, and the optical device 222 is used to improve the spectral purity of the secondary light L2 passing through the optical device 224. As shown in FIG. 7B and FIG. 8B, the optical device 224 allows the excitation light L1 to pass through and reflects the secondary light L2, and the optical device 222 is used to improve the spectral purity of the secondary light L2 reflected by the optical device 224.

The apparatus 200 for inspecting the LED dies shown in FIG. 7A, FIG. 7B, FIG. 8A, and FIG. 8B is the same as the apparatus 200 for inspecting the LED dies shown in FIG. 4A, FIG. 4B, FIG. 5A, FIG. 5B, FIG. 6A and FIG. 6B, and therefore the structural details of the inspection apparatus 200 are not repeated herein.

In the present embodiment, the inspection substrate 210 has a conductive layer 212, and the inspection substrate 210 is a rigid substrate or a flexible substrate that may be moved in the vertical direction. Via proper movement of the inspection substrate 210, the conductive layer 212 on the inspection substrate 210 may make the first electrodes 102' and the second electrodes 104' of the LED dies 100' to be inspected be in different states. When the conductive layer 212 on the inspection substrate 210 is in contact with the first electrodes 102' and the second electrodes 104' at the same time, the first electrodes 102' and the second electrodes 104' of the LED dies 100' to be inspected are in a short-circuit state, as shown in FIG. 7A and FIG. 7B. When a sufficient distance is maintained between the conductive layer 212 on the inspection substrate 210 and the first electrodes 102' and the second electrodes 104', the first electrodes 102' and the second electrodes 104' of the LED dies 100' to be inspected are in an open-circuit state, as shown in FIG. 8A and FIG. 8B.

Referring to FIG. 4A, FIG. 4B, FIG. 5A, FIG. 5B, FIG. 7A, FIG. 7B, FIG. 8A, and FIG. 8B, the computer 240 is electrically connected to the optical sensor 230 to receive the output of the optical sensor 230.

In some embodiments, the output of the optical sensor 230 includes a plurality of first spectra captured when the first electrodes 102 and 102' and the second electrodes 104 and 104' of the LED dies 100 and 100' to be inspected are in an open-circuit state (as shown in FIG. 5A, FIG. 5B, FIG. 8A, and FIG. 8B), and a plurality of second spectra captured when the first electrodes 102 and 102' and the second electrodes 104 and 104' of the plurality of LED dies 100 and 100' to be inspected are in a short-circuit state (as shown in FIG. 4A, FIG. 4B, FIG. 7A, and FIG. 7B). Moreover, the computer 240 may be used to compare the difference between the first spectra and the second spectra. Here, the difference between the first spectra and the second spectra includes a difference in peak wavelength, a difference in dominant wavelength, a difference in peak wavelength intensity, or a difference in spectral intensity.

In some embodiments, the output of the optical sensor 230 includes a plurality of first spectra captured when the first electrodes 102 and 102' and the second electrodes 104 and 104' of the LED dies 100 and 100' to be inspected are in an open-circuit state (as shown in FIG. 5A, FIG. 5B, FIG. 8A, and FIG. 8B), and a plurality of third spectra captured when the first electrodes 102 and 102' and the second electrodes 104 and 104' of the LED dies 100 and 100' to be inspected are subjected to an inspection voltage bias (as shown in FIG. 6A and FIG. 6B). Moreover, the computer 240 may be used to compare the difference between the first spectra and the third spectra, and the difference between the first spectra and the third spectra includes a difference in peak wavelength, a difference in dominant wavelength, a difference in peak wavelength intensity, or a difference in spectral intensity.

In some embodiments, the output of the optical sensor 230 includes a plurality of second spectra captured when the first electrodes 102 and 102' and the second electrodes 104 and 104' of the LED dies 100 and 100' to be inspected are in a short-circuit state (as shown in FIG. 4A, FIG. 4B, FIG. 7A, and FIG. 7B), and a plurality of third spectra captured when the first electrodes 102 and 102' and the second electrodes 104 and 104' of the LED dies 100 and 100' to be inspected are subjected to an inspection voltage bias (as shown in FIG. 6A and FIG. 6B). Moreover, the computer 240 may be used to compare the difference between the second spectra and the third spectra, and the difference between the second spectra and the third spectra includes a difference in peak wavelength, a difference in dominant wavelength, a difference in peak wavelength intensity, or a difference in spectral intensity.

In some embodiments, the output of the optical sensor 230 includes a plurality of second spectra captured when the first electrodes 102 and 102' and the second electrodes 104 and 104' of the LED dies 100 and 100' to be inspected are in a short-circuit state (as shown in FIG. 4A, FIG. 4B, FIG. 7A, and FIG. 7B), and the computer 240 may be used to compare the difference of the second spectra, and the difference of the second spectra includes a difference in peak wavelength, a difference in dominant wavelength, a difference in peak wavelength intensity, or a difference in spectral intensity. It should be noted that although the above method may not detect the short-circuit defect in the LED dies 100 and 100' to be inspected themselves, in addition to the above situation, in the above method, the computer 240 may still compare the difference of the second spectra, and then determine whether the LED dies 100 and 100' to be inspected have other abnormal conditions or classify them into different grades.

In some embodiments, the output of the optical sensor 230 includes a plurality of third spectra captured when the first electrodes 102 and 102' and the second electrodes 104 and 104' of the LED dies 100 and 100' to be inspected are subjected to a plurality of inspection bias voltages, and the computer 240 may be used to compare the difference of the third spectra, and the difference of the third spectra includes a difference in peak wavelength, a difference in dominant wavelength, a difference in peak wavelength intensity, or a difference in spectral intensity.

In some embodiments, the output of the optical sensor 230 includes a plurality of third spectra captured when the first electrodes 102 and 102' and the second electrodes 104 and 104' of the LED dies 100 and 100' to be inspected are subjected to the same inspection bias voltage, and the computer 240 may be used to compare the difference of the third spectra, and the difference of the third spectra includes a difference in peak wavelength, a difference in dominant wavelength, a difference in peak wavelength intensity, or a difference in spectral intensity.

Figure 9:
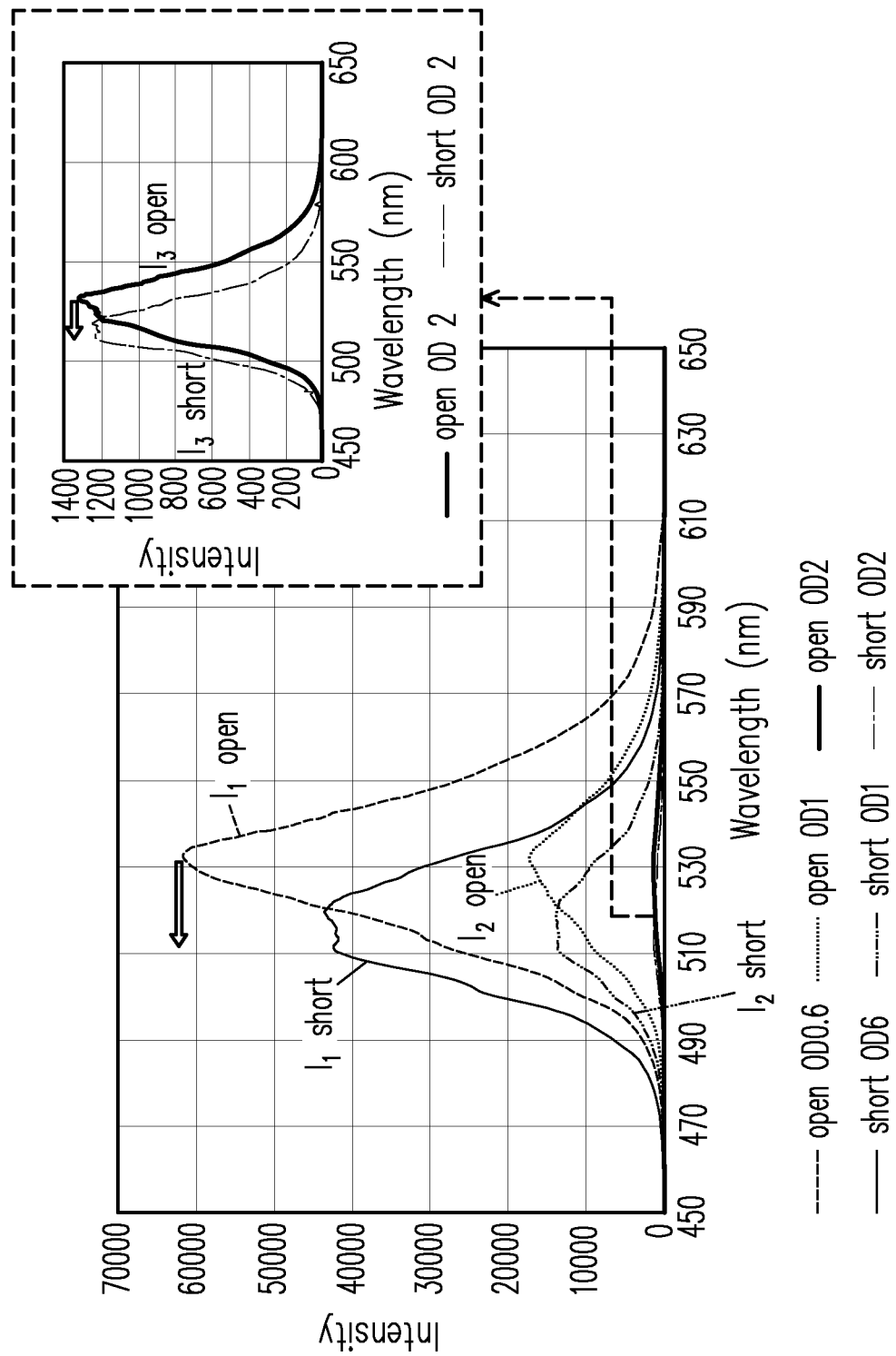
FIG. 9 shows the spectrum of secondary light measured when excitation light with different intensities is irradiated on a normal LED die.

FIG. 9 shows the spectrum of secondary light measured when a normal LED die is irradiated with different excitation light.

Referring to FIG. 9, in the present embodiment, when the P and N electrodes of the LED die are in an open-circuit state and a short-circuit state, the LED die to be inspected is irradiated with excitation light of three different intensities $I_1$, $I_2$, and $I_3$, respectively, wherein the excitation light of three different intensities $I_1$, $I_2$, and $I_3$ are obtained by the light source passing through different intensity attenuators (for example, OD0.6, OD1, OD2), wherein the intensity $I_1$ is the largest, the intensity $I_2$ is smaller, and the intensity $I_3$ is the smallest. When the P and N electrodes of the LED die are in an open-circuit state, the normal LED die to be inspected is irradiated with the excitation light of the intensity $I_1$, and the optical sensor may capture a spectrum $I_{1\ open}$ of the secondary light; when the P and N electrodes of the LED die are in a short-circuit state, the normal LED die to be inspected is irradiated with excitation light of intensity $I_1$, and the optical sensor may capture a spectrum $I_{1\ short}$ of the secondary light; when the P and N electrodes of the LED die are in an open-circuit state, the normal LED die to be inspected is irradiated with the excitation light of the intensity $I_2$, and the optical sensor may capture a spectrum $I_{2\ open}$ of the secondary light; when the P and N electrodes of the LED die are in a short-circuit state, the normal LED die to be inspected is irradiated with the excitation light of the intensity $I_2$, and the optical sensor may capture a spectrum $I_{2\ short}$ of the secondary light; when the P and N electrodes of the LED die are in an open-circuit state, the normal LED die to be inspected is irradiated with the excitation light of the intensity $I_3$, and the optical sensor may capture a spectrum $I_{3\ open}$ of the secondary light; and when the P and N electrodes of the LED die are in a short-circuit state, the normal LED die to be inspected is irradiated with the excitation light of the intensity $I_3$, and the optical sensor may capture a spectrum $I_{3\ short}$ of the secondary light.

It may be known from FIG. 9 that for a normal LED die to be inspected, the peak wavelengths or dominant wavelengths of the spectra $I_{1\ open}$, $I_{2\ open}$, and $I_{3\ open}$ of the secondary light captured by the optical sensor are respectively greater than the peak wavelengths or dominant wavelengths of the spectra $I_{1\ short}$, $I_{2\ short}$, and $I_{3\ short}$. In other words, compared to the spectra $I_{1\ open}$, $I_{2\ open}$, $I_{3\ open}$, the spectra $I_{1\ short}$, $I_{2\ short}$, and $I_{3\ short}$ have a phenomenon of blue shift, wherein the amount of the blue shift is related to the intensities I1, I2, and I3 of the excitation light. In an embodiment, the difference between the peak wavelength or dominant wavelength in a short-circuit condition and the peak wavelength or dominant wavelength in an open-circuit condition may be 5 nm to 30 nm. Moreover, the peak wavelength intensities or spectral intensities of the spectra $I_{1\ open}$, $I_{2\ open}$, and $I_{3\ open}$ are respectively greater than the peak wavelength intensities or spectral intensities of the spectra $I_{1\ short}$, $I_{2\ short}$, and $I_{3\ short}$. In an embodiment, the peak wavelength intensity, dominant wavelength intensity, or spectral intensity in a short-circuit condition may be 0.5× to 1× the peak wavelength intensity, dominant wavelength intensity, or spectral intensity in an open-circuit condition.

Figure 10:
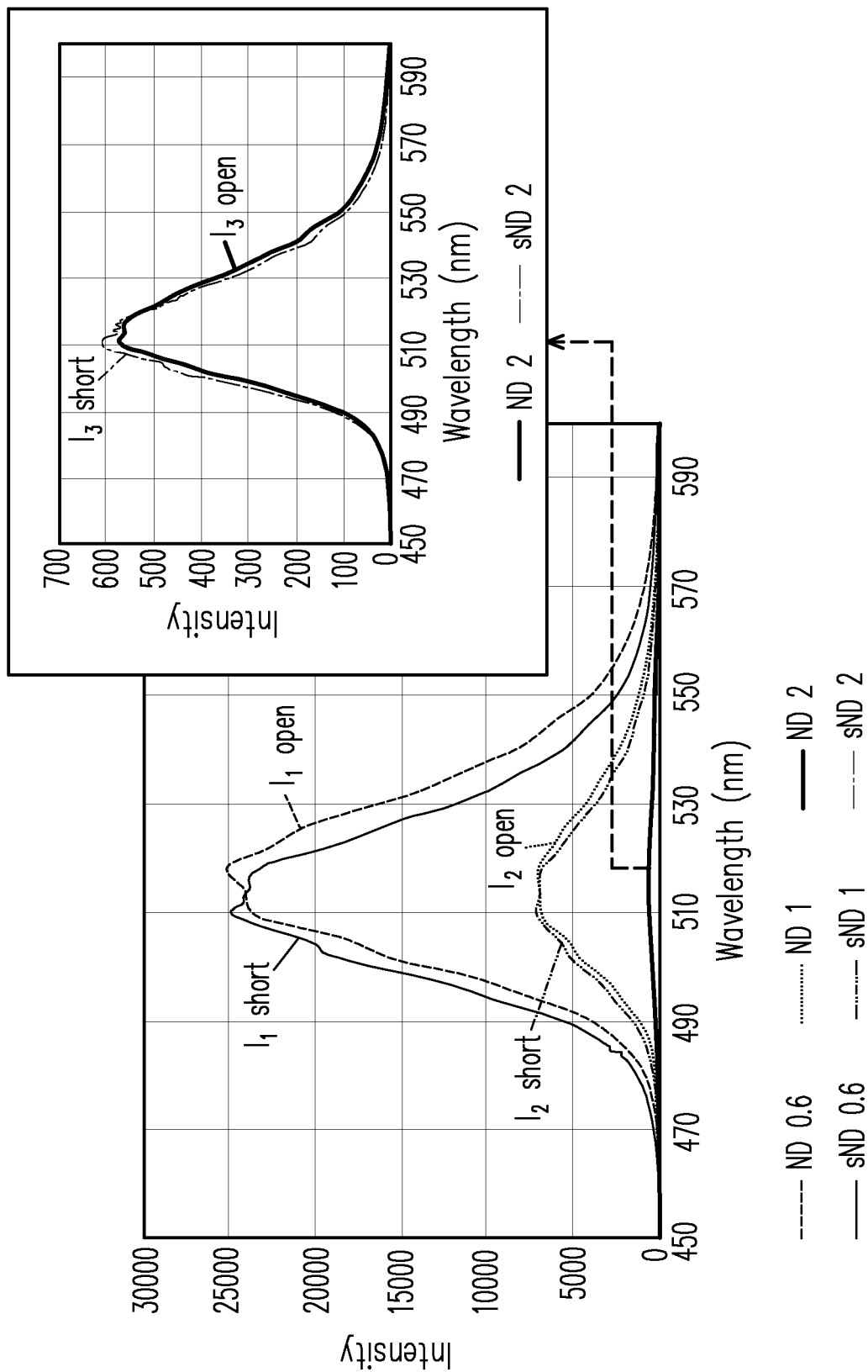
FIG. 10 shows the spectrum of secondary light measured when excitation light with different intensities is irradiated on an LED die with significant leakage current phenomenon.

FIG. 10 shows the spectrum of secondary light measured when different excitation light is irradiated on an LED die with significant leakage current phenomenon.

Referring to FIG. 10, when the P and N electrodes of the LED die are in an open-circuit state, the LED die to be inspected with significant leakage current phenomenon is irradiated with the excitation light of the intensity $I_1$, and the optical sensor may capture the spectrum $I_{1\ open}$ of the secondary light; when the P and N electrodes of the LED die are in a short-circuit state, the LED die to be inspected with significant leakage current phenomenon are irradiated with excitation light of intensity $I_1$, and the optical sensor may capture the spectrum $I_{1\ short}$ of the secondary light; when the P and N electrodes of the LED die are in an open-circuit state, the LED die to be inspected with significant leakage current phenomenon is irradiated with the excitation light of the intensity $I_2$, and the optical sensor may capture the spectrum $I_{2\ open}$ of the secondary light; when the P and N electrodes of the LED die are in a short-circuit state, the LED die to be inspected with significant leakage current phenomenon is irradiated with the excitation light of the intensity $I_2$, and the optical sensor may capture the spectrum $I_{2\ short}$ of the secondary light; when the P and N electrodes of the LED die are in an open-circuit state, the LED die to be inspected with significant leakage current phenomenon is irradiated with the excitation light of the intensity $I_3$, and the optical sensor may capture the spectrum $I_{3\ open}$ of the secondary light; and when the P and N electrodes of the LED die are in a short-circuit state, the LED die to be inspected with significant leakage current phenomenon is irradiated with the excitation light of the intensity $I_3$, and the optical sensor may capture the spectrum $I_{3\ short}$ of the secondary light.

It may be known from FIG. 10 that for the LED die to be inspected with significant leakage current phenomenon, the peak wavelengths or dominant wavelengths of the spectra $I_{1\ open}$, $I_{2\ open}$, and $I_{3\ open}$ of the secondary light captured by the optical sensor may be close to or even consistent with the peak wavelengths or dominant wavelengths of the spectra $I_{1\ short}$, $I_{2\ short}$, and $I_{3\ short}$. In other words, compared with the spectra $I_{1\ open}$, $I_{2\ open}$, and $I_{3\ open}$, the blue-shift phenomenon of the spectra $I_{1\ short}$, $I_{2\ short}$, and $I_{3\ short}$ is less significant or even disappears. In addition, the peak wavelength intensities or spectral intensities of the spectra $I_{1\ open}$, $I_{2\ open}$, and $I_{3\ open}$ may be close to or even consistent with the peak wavelength intensities or spectral intensities of the spectra $I_{1\ short}$, $I_{2\ short}$, and $I_{3\ short}$.

Figure 11:
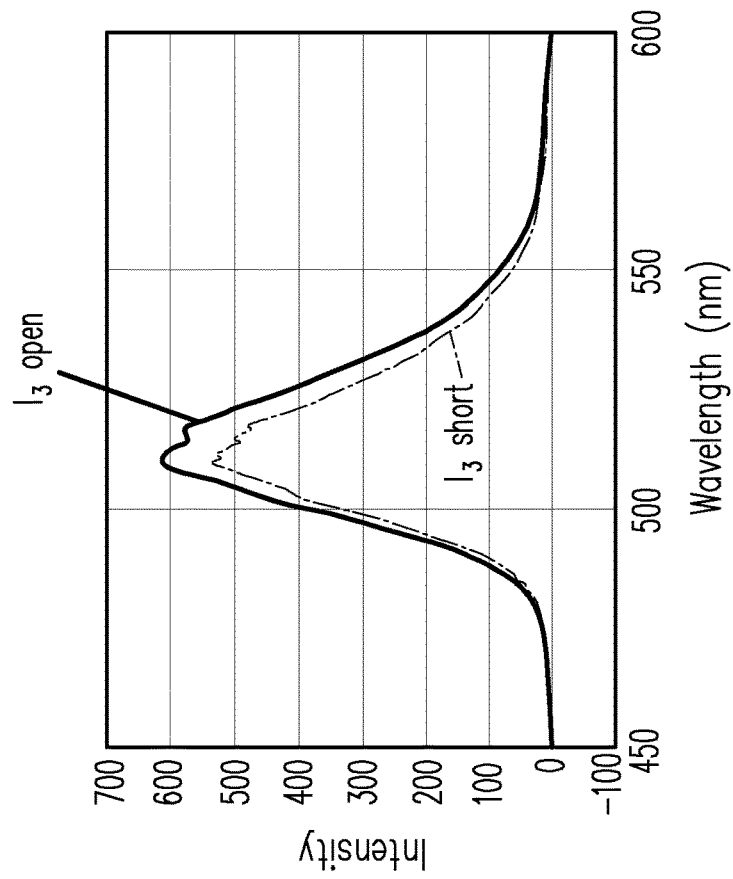
FIG. 11 shows the spectrum of secondary light measured when excitation light with weaker intensity is irradiated on an LED die with slight leakage current phenomenon.
Figure 11:
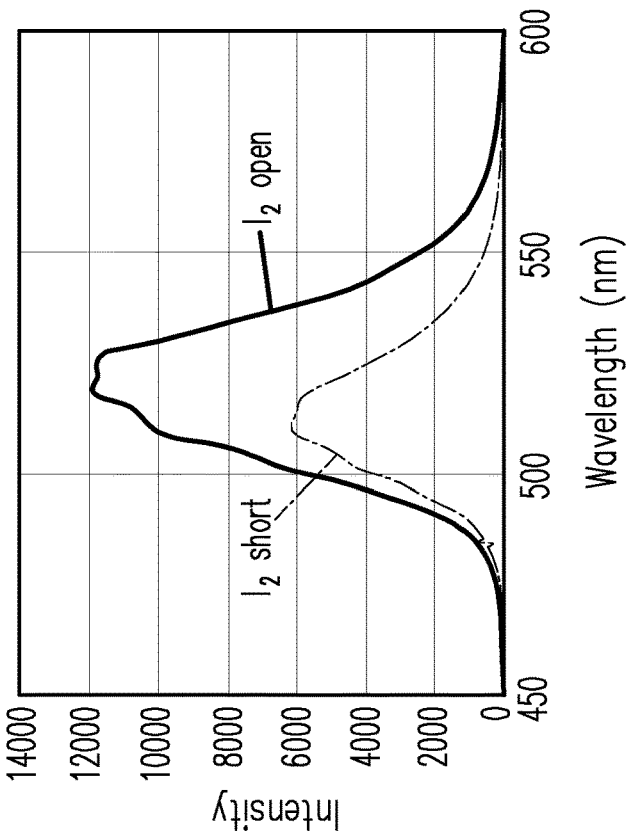

FIG. 11 shows the spectrum of secondary light measured when excitation light with weaker intensity is irradiated on an LED die with slight leakage current.

Referring to FIG. 11, when the P and N electrodes of the LED die are in an open-circuit state, the LED die to be inspected with a slight leakage current phenomenon is irradiated with the excitation light of intensity $I_2$, and the optical sensor may capture the spectrum $I_{2\ open}$ of the secondary light; when the P and N electrodes of the LED die are in a short-circuit state, the LED die to be inspected with a slight leakage current phenomenon is irradiated with the excitation light of the intensity $I_2$, and the optical sensor may capture the spectrum $I_{2\ short}$ of the secondary light; when the P and N electrodes of the LED die are in an open-circuit state, the LED die to be inspected with a slight leakage current phenomenon is irradiated with the excitation light of intensity $I_3$, and the optical sensor may capture the spectrum $I_{3\ open}$ of the secondary light; and when the P and N electrodes of the LED die are in a short-circuit state, the LED die to be inspected with a slight leakage current phenomenon is irradiated with the excitation light of the intensity $I_3$, and the optical sensor may capture the spectrum $I_{3\ short}$ of the secondary light.

It may be known from FIG. 11 that, for the LED die to be inspected with slight leakage current, the peak wavelengths or dominant wavelengths of the spectra $I_{2\ open}$ and $I_{3\ open}$ of the secondary light captured by the optical sensor are close to or even consistent with the peak wavelengths or dominant wavelengths of the spectra $I_{2\ short}$ and $I_{3\ short}$. In other words, relative to the spectrum $I_{3\ open}$, the blue shift phenomenon of the spectrum $I_{3\ short}$ is less significant or even disappears. As described above, by properly selecting the intensity of the excitation light, the slight leakage current phenomenon of the LED die to be inspected may be detected.

Figure 13:
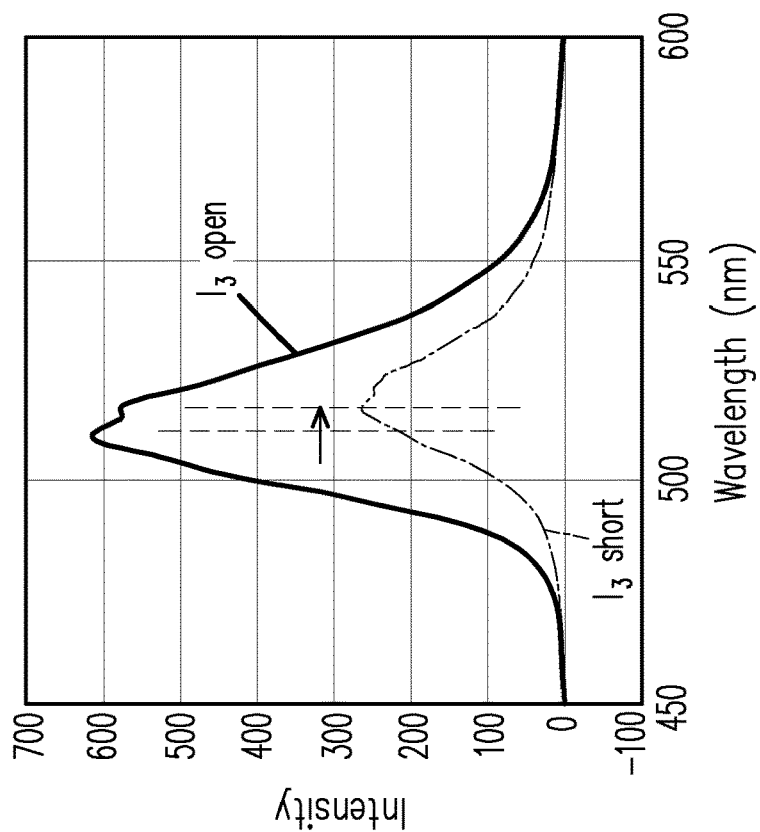
FIG. 12 and FIG. 13 respectively show the spectrum of secondary light measured when an LED die with abnormal forward voltage (Vf) is irradiated with excitation light of weaker intensity.
Figure 12:
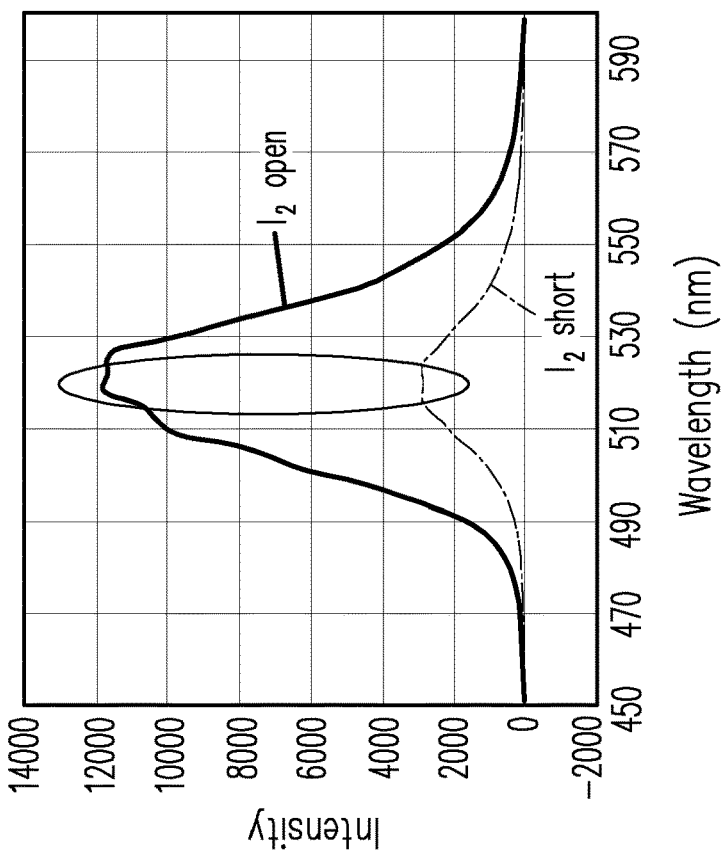
Figure 14:
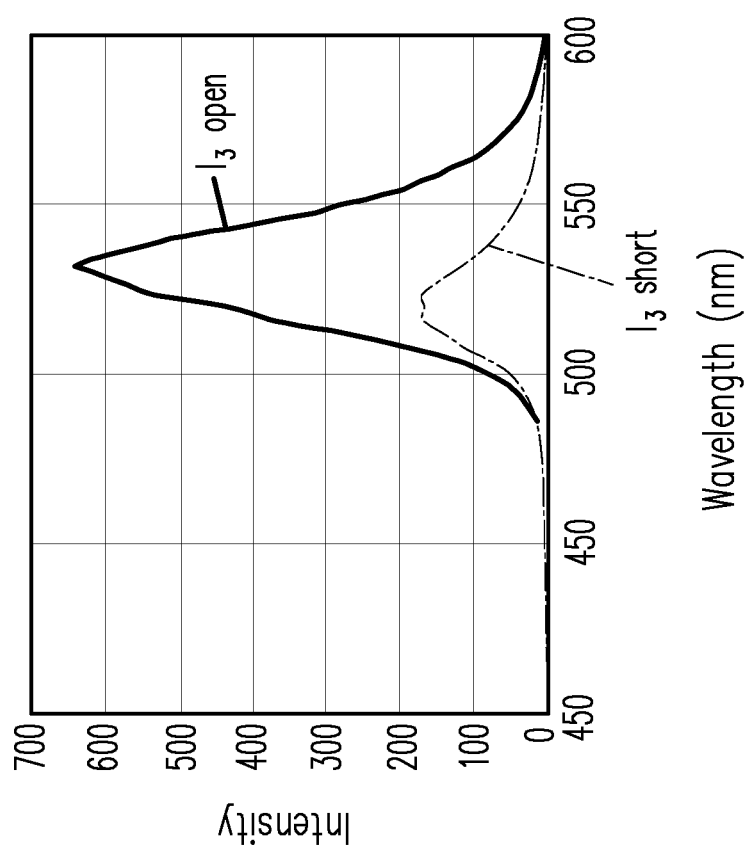
FIG. 14 shows the spectrum of secondary light measured when an LED die with abnormal forward voltage (Vf) is irradiated with excitation light of weaker intensity.

FIG. 12 and FIG. 13 respectively show the spectrum of secondary light measured when an LED die with abnormal forward voltage (Vf) is irradiated with excitation light of weaker intensity $I_2$ and $I_3$, and FIG. 14 shows the spectrum of secondary light measured when an LED die with abnormal forward voltage (Vf) is irradiated with excitation light of weaker intensity.

Referring to FIG. 12 and FIG. 13, when the P and N electrodes of the LED die are in an open-circuit state, the LED die to be inspected with abnormal forward voltage (Vf) is irradiated with the excitation light of intensity $I_2$, and the optical sensor may capture the spectrum $I_{2\ open}$ of the secondary light; when the P and N electrodes of the LED die are in a short-circuit state, the LED die to be inspected with abnormal forward voltage (Vf) is irradiated with the excitation light of the intensity $I_2$, and the optical sensor may capture the spectrum $I_{2\ short}$ of the secondary light; when the P and N electrodes of the LED die are in an open-circuit state, the LED die to be inspected with abnormal forward voltage (Vf) is irradiated with the excitation light of intensity $I_3$, and the optical sensor may capture the spectrum $I_{3\ open}$ of the secondary light; and when the P and N electrodes of the LED die are in a short-circuit state, the LED die to be inspected with abnormal forward voltage (Vf) is irradiated with the excitation light of the intensity $I_3$, and the optical sensor may capture the spectrum $I_{3\ short}$ of the secondary light.

It may be known from FIG. 12 that, for the LED die to be inspected with abnormal forward voltage (Vf), the peak wavelength or dominant wavelength of the spectrum $I_{2\ open}$ of the secondary light captured by the optical sensor is close to or even consistent with the peak wavelength or dominant wavelength of the spectrum $I_{2\ short}$. In other words, relative to the spectrum $I_{2\ open}$, the blue shift phenomenon of the spectrum $I_{2\ short}$ is less significant or even disappears. In addition, the peak wavelength intensity, dominant wavelength intensity, or spectral intensity of spectrum $I_{2\ short}$ is less than one-half of the peak wavelength intensity, dominant wavelength intensity, or spectral intensity of spectrum $I_{2\ open}$.

It may be known from FIG. 13 that, for the LED die to be inspected with abnormal forward voltage (Vf), the peak wavelength or dominant wavelength of the spectrum $I_{3\ open}$ of the secondary light captured by the optical sensor is less than the peak wavelength or dominant wavelength of the spectrum $I_{3\ short}$. In other words, compared to the spectrum $I_{3\ open}$, the spectrum $I_{3\ short}$ may have a red shift phenomenon. In addition, the peak wavelength intensity, dominant wavelength intensity, or spectral intensity of spectrum $I_{2\ short}$ is less than one-half of the peak wavelength intensity, dominant wavelength intensity, or spectral intensity of spectrum $I_{2\ open}$. As mentioned above, by properly selecting the intensity of the excitation light, the abnormal phenomenon of the forward voltage (Vf) of the LED die to be inspected may be detected.

It may be known from FIG. 14 that, for the LED die to be inspected with abnormal forward voltage (Vf), the peak wavelength intensity, dominant wavelength intensity, or spectral intensity of the spectrum $I_{3\ short}$ of the secondary light captured under a suitable excitation light intensity is less than one-third of the peak wavelength intensity, dominant wavelength intensity, or the spectral intensity of the spectrum $I_{3\ open}$. As mentioned above, by properly selecting the intensity of the excitation light, the abnormal phenomenon of the forward voltage (Vf) of the LED die to be inspected may be detected.

In the embodiments of the disclosure, by performing statistics and analysis on the spectra of a large number of captured secondary light, and by the methods described in FIG. 9 to FIG. 13, abnormal LED dies with outlier data may be found. For example, when the spectral data of the secondary light emitted by a certain LED die to be inspected is different from the spectral data of the secondary light emitted by other LED dies to be inspected, and when the difference exceeds a certain threshold, the LED die to be inspected may be determined as abnormal or classified into a different grade.

Based on the above, the electrodes of the LED dies to be inspected in the above embodiments of the disclosure provide excitation light under different conditions (e.g., open-circuit, short-circuit, and/or subject to inspection bias voltage), the secondary light emitted by the LED dies is captured under the above different conditions, and whether the LED dies are abnormal or not or classified is determined according to the captured secondary light. Therefore, the embodiments of the disclosure may efficiently inspect all LED dies in the wafer, all LED dies mounted on the driving backplane but not fully electrically connected to the driving backplane, or all LED dies bonded to the driving backplane.

What is claimed is:

1. An apparatus for inspecting light-emitting diode (LED) dies, suitable for inspecting a plurality of LED dies having first electrodes and second electrodes, the apparatus for inspecting the LED dies comprising:
   an inspection substrate having a conductive layer, wherein the first electrodes and the second electrodes are open when the first electrodes and the second electrodes are not electrically connected via the conductive layer, the inspection substrate shorts the first electrode and the second electrode of each of the plurality of light-emitting diode dies to be inspected via the conductive layer, or the inspection substrate applies an inspection bias voltage between the first electrodes and the second electrodes of the plurality of LED dies to be inspected via the conductive layer;
   a light source providing an excitation light to irradiate the plurality of LED dies to be inspected, and the plurality of LED dies to be inspected emit a secondary light after being irradiated by the excitation light;
   an optical sensor capturing the secondary light when the first electrodes and the second electrodes of the plurality of LED dies to be inspected are open, short-circuited, and/or subjected to the inspection bias voltage; and
   a computer electrically connected with the optical sensor to receive an output of the optical sensor.

2. The apparatus for inspecting the LED dies of claim 1, wherein the light source and the optical sensor are disposed on a same side of the inspection substrate.

3. The apparatus for inspecting the LED dies of claim 1, wherein the optical sensor comprises a spectrometer or an image sensor.

4. The apparatus for inspecting the LED dies of claim 1,
   wherein the output of the optical sensor comprises a plurality of first spectra captured when the first electrodes and the second electrodes of the plurality of LED dies to be inspected are open, and a plurality of second spectra captured when the first electrodes and the second electrodes of the plurality of LED dies to be inspected are short-circuited, wherein the computer compares a difference of the plurality of first spectra and the plurality of second spectra, and the difference of the plurality of first spectra and the plurality of second spectra comprises a difference in peak wavelength, a difference in dominant wavelength, a difference in peak wavelength intensity, or a difference in spectral intensity.

5. The apparatus for inspecting the LED dies of claim 1, wherein the output of the optical sensor comprises a plurality of first spectra captured when the first electrodes and the second electrodes of the plurality of LED dies to be inspected are open, and a plurality of third spectra captured when the first electrodes and the second electrodes of the plurality of LED dies to be inspected are subjected to the inspection bias voltage, wherein the computer compares a difference of the plurality of first spectra and the plurality of third spectra, and the difference of the plurality of first spectra and the plurality of third spectra comprises a difference in peak wavelength, a difference in dominant wavelength, a difference in peak wavelength intensity, or a difference in spectral intensity.

6. The apparatus for inspecting the LED dies of claim 1, wherein the output of the optical sensor comprises a plurality of second spectra captured when the first electrodes and the second electrodes of the plurality of LED dies to be inspected are short-circuited, and a plurality of third spectra captured when the first electrodes and the second electrodes of the plurality of LED dies to be inspected are subjected to the inspection bias voltage, wherein the computer compares a difference of the plurality of second spectra and the plurality of third spectra, and the difference of the plurality of second spectra and the plurality of third spectra comprises a difference in peak wavelength, a difference in dominant wavelength, a difference in peak wavelength intensity, or a difference in spectral intensity.

7. The apparatus for inspecting the LED dies of claim 1, wherein the output of the optical sensor comprises a plurality of second spectra captured when the first electrodes and the second electrodes of the plurality of LED dies to be inspected are short-circuited, wherein the computer compares a difference of the plurality of second spectra, and the difference of the plurality of second spectra comprises a difference in peak wavelength, a difference in dominant wavelength, a difference in peak wavelength intensity, or a difference in spectral intensity.

8. The apparatus for inspecting the LED dies of claim 1, wherein the output of the optical sensor comprises a plurality of third spectra captured when the first electrodes and the second electrodes of the plurality of LED dies to be inspected are subjected to a plurality of inspection bias voltages, wherein the computer compares a difference of the plurality of third spectra, and the difference of the plurality of third spectra comprises a difference in peak wavelength, a difference in dominant wavelength, a difference in peak wavelength intensity, or a difference in spectral intensity.

9. The apparatus for inspecting the LED dies of claim 1, wherein the output of the optical sensor comprises a plurality of third spectra captured when the first electrodes and the second electrodes of the plurality of LED dies to be inspected are subjected to a same inspection bias voltage, wherein the computer compares a difference of the plurality of third spectra, and the difference of the third spectra comprises a difference in peak wavelength, a difference in dominant wavelength, a difference in peak wavelength intensity, or a difference in spectral intensity.

10. A method for inspecting light-emitting diode (LED) dies, comprising:
providing a plurality of LED dies to be inspected, the plurality of LED dies having first electrodes and the second electrodes, wherein the first electrodes and the second electrodes are open;
shorting a first electrode and a second electrode of each of a plurality of LED dies to be inspected via a conductive layer on an inspection substrate, or applying an inspection bias voltage between the first electrodes and the second electrodes of the plurality of LED dies to be inspected via the conductive layer of the inspection substrate;
irradiating the plurality of LED dies to be inspected with an excitation light, so that the plurality of LED dies to be inspected emit a plurality of secondary light;
capturing the plurality of secondary light via an optical sensor when the first electrodes and the second electrodes of the plurality of LED dies to be inspected are open, short-circuited, and/or subjected to the inspection bias voltage; and
receiving an output of the optical sensor via a computer and calculating a spectrum difference of the plurality of secondary light to determine whether the plurality of LED dies are abnormal or to classify the plurality of LED dies to be inspected.

11. The method for inspecting the LED dies of claim 10, wherein the output of the optical sensor comprises a plurality of first spectra captured when the first electrodes and the second electrodes of the plurality of LED dies to be inspected are open, and a plurality of second spectra captured when the first electrodes and the second electrodes of the plurality of LED dies to be inspected are short-circuited, wherein the computer compares a difference of the plurality of first spectra and the plurality of second spectra, and the difference of the plurality of first spectra and the plurality of second spectra comprises a difference in peak wavelength, a difference in dominant wavelength, a difference in peak wavelength intensity, or a difference in spectral intensity.

12. The method for inspecting the LED dies of claim 10, wherein the output of the optical sensor comprises a plurality of first spectra captured when the first electrodes and the second electrodes of the plurality of LED dies to be inspected are open, and a plurality of third spectra captured when the first electrodes and the second electrodes of the plurality of LED dies to be inspected are subjected to the inspection bias voltage, wherein the computer compares a difference of the plurality of first spectra and the plurality of third spectra, and the difference of the plurality of first spectra and the plurality of third spectra comprises a difference in peak wavelength, a difference in dominant wavelength, a difference in peak wavelength intensity, or a difference in spectral intensity.

13. The method for inspecting the LED dies of claim 10, wherein the output of the optical sensor comprises a plurality of second spectra captured when the first electrodes and the second electrodes of the plurality of LED dies to be inspected are short-circuited, and a plurality of third spectra captured when the first electrodes and the second electrodes of the plurality of LED dies to be inspected are subjected to the inspection bias voltage, wherein the computer compares a difference of the plurality of second spectra and the plurality of third spectra, and the difference of the plurality of second spectra and the plurality of third spectra comprises a difference in peak wavelength, a difference in dominant wavelength, a difference in peak wavelength intensity, or a difference in spectral intensity.

14. The method for inspecting the LED dies of claim 10, wherein the output of the optical sensor comprises a plurality of second spectra captured when the first electrodes and the second electrodes of the plurality of LED dies to be inspected are short-circuited, wherein the computer compares a difference of the plurality of second spectra, and the difference of the plurality of second spectra comprises a difference in peak wavelength, a difference in dominant wavelength, a difference in peak wavelength intensity, or a difference in spectral intensity.

15. The method for inspecting the LED dies of claim 10, wherein the output of the optical sensor comprises a plurality of third spectra captured when the first electrodes and the second electrodes of the plurality of LED dies to be inspected are subjected to a plurality of inspection bias voltages, wherein the computer compares a difference of the plurality of third spectra, and the difference of the plurality of third spectra comprises a difference in peak wavelength, a difference in dominant wavelength, a difference in peak wavelength intensity, or a difference in spectral intensity.

16. The method for inspecting the LED dies of claim 10, wherein the output of the optical sensor comprises a plurality of third spectra captured when the first electrodes and the second electrodes of the plurality of LED dies to be inspected are subjected to a same inspection bias voltage, wherein the computer compares a difference of the plurality of third spectra, and the difference of the third spectra comprises a difference in peak wavelength, a difference in dominant wavelength, a difference in peak wavelength intensity, or a difference in spectral intensity.

* * * * *